United States Patent
Hashimoto et al.

(10) Patent No.: US 9,246,308 B2
(45) Date of Patent: Jan. 26, 2016

(54) QUANTUM CASCADE LASER

(71) Applicant: SUMITOMO ELECTRIC INDUSTRIES, LTD., Osaka-shi, Osaka (JP)

(72) Inventors: Jun-ichi Hashimoto, Chigasaki (JP); Michio Murata, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/292,291

(22) Filed: May 30, 2014

(65) Prior Publication Data
US 2014/0355634 A1  Dec. 4, 2014

(30) Foreign Application Priority Data
May 31, 2013  (JP) ................. 2013-115871

(51) Int. Cl.
*H01S 5/00* (2006.01)
*H01S 5/227* (2006.01)
*H01S 5/34* (2006.01)
*H01S 5/22* (2006.01)
*H01S 5/024* (2006.01)
*H01S 5/40* (2006.01)

(52) U.S. Cl.
CPC ............. *H01S 5/227* (2013.01); *H01S 5/2224* (2013.01); *H01S 5/3402* (2013.01); *H01S 5/02461* (2013.01); *H01S 5/4087* (2013.01); *H01S 2301/176* (2013.01)

(58) Field of Classification Search
CPC ... H01S 5/1014; H01S 5/1032; H01S 5/1039; H01S 5/1092; H01S 5/1096; H01S 5/12; H01S 5/1215; H01S 5/125; H01S 5/141; H01S 5/183

USPC ..................... 372/45.012, 39, 41
See application file for complete search history.

(56) References Cited

U.S. PATENT DOCUMENTS

| | | | | |
|---|---|---|---|---|
| 4,644,553 | A | * | 2/1987 | Van Ruyven ......... B82Y 20/00 257/22 |
| 4,727,557 | A | * | 2/1988 | Burnham et al. .......... 372/50.12 |
| 4,751,711 | A | * | 6/1988 | Welch et al. ............. 372/50.123 |

(Continued)

OTHER PUBLICATIONS

G.M. de Naurois et al., "High Thermal Performance of μ-Stripes Quantum Cascade Laser", Applied Physics Letters, vol. 101, 041113, 2012.

(Continued)

*Primary Examiner* — Tod T Van Roy
*Assistant Examiner* — Vu A Vu
(74) *Attorney, Agent, or Firm* — Smith, Gambrell & Russell LLP.

(57) ABSTRACT

A quantum cascade laser includes a semiconductor substrate including a principal surface; a mesa waveguide disposed on the principal surface of the semiconductor substrate, the mesa waveguide including a light emitting region and an upper cladding layer disposed on the light emitting region, the mesa waveguide extending in a direction orthogonal to a reference direction; and a current blocking layer formed on a side surface of the mesa waveguide. The light emitting region includes a plurality of core regions and a plurality of buried regions. The core regions and the buried regions are alternately arranged in the reference direction. The core region at a central portion of the mesa waveguide has a width smaller than a width of the core region at a peripheral portion of the mesa waveguide in the reference direction.

12 Claims, 17 Drawing Sheets

(56) References Cited

U.S. PATENT DOCUMENTS

| | | | | |
|---|---|---|---|---|
| 4,860,298 | A | * | 8/1989 | Botez et al. .............. 372/50.123 |
| 5,953,356 | A | * | 9/1999 | Botez .................... B82Y 20/00 |
| | | | | 372/45.01 |
| 6,567,445 | B1 | * | 5/2003 | Narui ................... H01S 5/4031 |
| | | | | 372/36 |
| 8,003,995 | B2 | * | 8/2011 | Murata .......................... 257/80 |
| 2010/0111127 | A1 | * | 5/2010 | Edamura et al. ......... 372/45.012 |
| 2013/0243025 | A1 | * | 9/2013 | Motoda .............. H01S 5/02461 |
| | | | | 372/46.01 |

OTHER PUBLICATIONS

G.M. de Naurois et al., "*Coherent Quantum Cascade Laser Micro-Stripe Arrays*", AIP Advances, 1, 032165 2011.

Specification and drawings of co-filed application also entitled Quantum Cascade Laser and also by inventors J. Hashimoto and M. Murata.

Office Action dated Sep. 26, 2014, in related U.S. Appl. No. 14/292,250.

* cited by examiner

FIG. 4

| S (μm) | ΔTavg (K) at $W_2/W_1=1$ | $W_2/W_1$ range for ΔTavg lower than ΔTavg at $W_2/W_1=1$ |
|---|---|---|
| 0.5 | 43.9 | $1 < W_2/W_1 \leq 2$ |
| 1 | 36.0 | $1 < W_2/W_1 \leq 2$ |
| 2 | 28.7 | $1 < W_2/W_1 < 1.8$ |
| 3 | 24.5 | $1 < W_2/W_1 < 1.6$ |

QUANTUM CASCADE LASER

BACKGROUND OF THE INVENTION

1. Field of the Invention

The present invention relates to a quantum cascade laser.

2. Description of the Related Art

A quantum cascade laser (QCL) emits light of a mid-infrared wavelength range of approximately 3 µm to 20 µm. (A quantum cascade laser may hereunder be referred to as "QCL".) Light of the mid-infrared wavelength range is used in environmental gas analysis, medical diagnosis, and industrial processing. Therefore, a quantum cascade laser is used in these fields. In particular, a quantum well cascade laser is small, has high-speed characteristics, and is low in cost. Therefore, the quantum well cascade laser is promising as a light source of the mid-infrared wavelength range.

In conventional QCLs, in order to achieve laser oscillation, it is necessary to supply high electric power of a few W to a core region, which is a light emitting layer. Therefore, when driving the QCLs, a large amount of heat is generated in the core region. This heat causes the temperature of the core region to rise excessively. As a result, QCL characteristics are deteriorated; for example, threshold current is increased, light output is reduced, and high-temperature operation becomes difficult to achieve.

Recently, a QCL including a multi-core structure (divided-core structure) in which a core region of the QCL is divided into a plurality of tiny regions is proposed. Such a QCL is described in, for example, "Applied Physics Letters, vol. 101, 041113, 2012" (Non Patent Literature 1 (NPL 1)) and "AIP ADVANCES, 1, 032165, 2011" (Non Patent Literature 2 (NPL 2)).

For example, the structure that is described in NPL 2 is schematically shown in FIG. 16. As shown in FIG. 16, in a QCL having a divided-core structure, buried regions having a width D are formed between many core regions (such as 16 regions) having a uniform width W. The buried regions are formed of InP. InP is a semiconductor material providing good thermal conductivity among semiconductor materials usable in QCLs of the mid-infrared wavelength range. Further, similarly to the buried regions, an upper layer at an upper side of the buried regions and a lower layer at a lower side of the buried regions are also formed of InP.

By such a divided-core structure, heat generated at the core regions is transmitted in a direction that is parallel to a principal surface of a substrate and perpendicular to a waveguide direction (hereunder referred to as "transverse direction") via the buried regions, and is efficiently dissipated to the outside of the core regions. In other words, by such a divided-core structure, heat dissipation in the transverse direction at each core region is improved.

As a result, compared to conventional QCLs in which core regions are not divided, the QCL having the divided-core structure is capable of sufficiently suppressing a temperature rise of each core region during operating. Therefore, QCL characteristics are improved; for example, light output is increased and maximum operating temperature is enhanced. NPL 1 actually reports that the QCL having the divided-core structure has a smaller thermal resistance, as compared to conventional QCLs in which core regions are not divided.

SUMMARY OF THE INVENTION

However, in QCLs having a divided-core structure, the core regions are divided with a uniform width. In this divided-core structure, the temperature of the core region at the central portion of the QCL is different from the temperature of the core region at the peripheral portion of the QCL during the operation. As a result, a temperature distribution occurs in the plurality of divided core regions. Here, the gain spectra of the core regions are a function of the temperatures of the core regions. Temperature variations in the core regions also cause variations in the gain spectra of the core regions. Consequently, the bandwidth of total gain spectrum is broadened, and an optical gain at a lasing wavelength is reduced. The reduction of the optical gain at the lasing wavelength causes degradation of lasing characteristics such as an increase of threshold current.

As described above, in QCLs having a divided-core structure, heat dissipation in each core region is improved. Therefore, the temperature rise of each core region is suppressed during operating. However, the temperature distribution occurs in the plurality of divided core regions due to the following reasons. Each of the divided core regions has a heat transfer path through which heat passes to the outside of the QCL device. Among the divided core regions, the core region at a central portion of the QCL device has a heat transfer path longer than that of the core region at a peripheral portion of the QCL device in the transverse direction. Therefore, heat generated at the core region in the central portion of the QCL device is not easily dissipated. Consequently, during the operation of the QCL, the temperature of the core region at the central portion of the QCL device tends to be higher than the temperature of the core region at the peripheral portion of the QCL device. As a result, the temperature difference between the core region at the central portion and the core region at the peripheral portion occurs.

Problems caused by such a temperature difference between the core regions are described with reference to FIGS. 17A and 17B. The vertical axes in FIGS. 17A and 17B represent an optical gain of the QCL. The horizontal axes in FIGS. 17A and 17B represent wavelength. First, when the divided core regions have the same temperature, as indicated by a spectrum Sp1 in FIG. 17A, gain spectrum distributions (dotted lines) of the corresponding core regions substantially match and overlap each other as one gain spectrum distribution. Therefore, an entire gain spectrum (spectrum Sp2 (solid line)) of the QCL device has high gain at an oscillation wavelength and a narrow line width. Here, the entire gain spectrum (spectrum Sp2 (solid line)) of the QCL device is obtained by adding the gain spectrum distributions of the corresponding core regions. Consequently, the QCL device has an ideal spectrum shape.

When such a temperature difference occurs between the core regions as mentioned above, the core regions have different gain characteristics from each other. As indicated by a spectrum Sp3 shown in FIG. 17B, the gain spectrum distributions (dotted lines) of the corresponding core regions do not overlap each other as one gain spectrum distribution. As a result, in an entire gain spectrum (spectrum Sp4 (solid line)) of the QCL device which is obtained by adding the gain spectrum distributions of the corresponding core regions, the line width of the gain spectrum is wider compared to that when there is no temperature difference between the core regions. In addition, the maximum optical gain at the oscillation wavelength is reduced. Such a reduction in the optical gain at the oscillation wavelength deteriorates oscillation characteristics of the QCL; for example, threshold current is increased and an oscillation mode becomes unstable.

A quantum cascade laser according to the present invention includes a semiconductor substrate including a principal surface; a mesa waveguide disposed on the principal surface of the semiconductor substrate, the mesa waveguide including a light emitting region and an upper cladding layer disposed on the light emitting region, the mesa waveguide extending in a direction orthogonal to a reference direction; and a current blocking layer formed on a side surface of the mesa waveguide. The light emitting region includes a plurality of core regions and a plurality of buried regions. The core regions and the buried regions are alternately arranged in the reference direction. In addition, the core region at a central portion of the mesa waveguide has a width smaller than a width of the core region at a peripheral portion of the mesa waveguide in the reference direction.

According to the quantum cascade laser (QCL), the width of a core region at a peripheral portion is larger than the width of a core region at the central portion in the reference direction. Therefore, the temperature difference between the core regions can be made lower than those in conventional structures. As a result, a reduction in an optical gain caused by the temperature difference between the core regions is mitigated or prevented. Therefore, QCL characteristics can be improved.

In the quantum cascade laser according to the present invention, the core region may have a width in a range of 0.5 µm to 10 µm in the reference direction. When the width of each core region becomes less than 0.5 µm, it is difficult to ensure reproducibility of each core region width in an etching process. On the other hand, for stable oscillation in a fundamental mode and high-temperature operation, the width of each core region is preferably within approximately 10 µm. Consequently, it is desirable that the width of each core region is in the range of approximately 0.5 µm to 10 µm.

In the quantum cascade laser according to the present invention, the buried region may have a width in a range of 0.5 µm to 10 µm in the reference direction. When the width of each buried region is less than 0.5 µm, for example, an abnormal growth occurs in the selective growth of the buried region. On the other hand, in order to optically couple the divided core regions with each other, the width of each buried region is set to be approximately 10 µm or less. In the range of the width of the buried region, a single waveguiding mode is generated in the mesa waveguide. Therefore, it is desirable that the width of each buried region is in the range of approximately 0.5 µm to 10 µm.

In the quantum cascade laser according to the present invention, the light emitting region may include a first core region and a second core region. The first core region may be positioned at the central portion of the mesa waveguide in the reference direction. The first core region may be arranged between the second core regions. In addition, the second core region has a width in a range that is greater than 1 times and less than 1.6 times a width of the first core region in the reference direction. When the width of the second region in the reference direction is set in the range that is greater than 1 times and less than 1.6 times the width of the first core region in the reference direction, the temperature difference between the core regions is made smaller than those in the conventional structures. Further, it is also possible to reduce the average temperature of the core regions as a whole. These two reductions make it possible for the optical gain at an oscillation wavelength to be greater than those in the conventional structures. As a result, lasing characteristics of the QCL can be improved.

In the quantum cascade laser according to the present invention, the buried region is preferably extended in a normal direction of the principal surface and in a direction opposite to the normal direction so as to protrude from the light emitting region. Since the buried regions having a high resistance are extended to a region other than the light-emitting region, the resistance between the divided core regions becomes high, so that insulation property is improved. Therefore, leakage current that flows between the core regions is reduced. As a result, it is possible to improve QCL characteristics; for example, threshold current can be reduced.

In the quantum cascade laser according to the present invention, the current blocking layer may be formed of an insulating film. In addition, the insulating film may be formed of at least one of $SiO_2$, SiON, SiN, alumina, BCB resin, and polyimide resin.

In the quantum cascade laser according to the present invention, the current blocking layer may be formed of a semi-insulating semiconductor. In addition, the current blocking layer may be formed of InP or AlInAs doped with at least one of Fe, Ti, Cr, and Co. Since a semi-insulating semiconductor has high resistance to electrons, the semi-insulating semiconductor is suitable for constituting the current blocking layer. In addition, a semi-insulating semiconductor has a low absorption coefficient for light having a mid-infrared wavelength. Therefore, even when the current blocking layer formed of such a semi-insulating semiconductor is introduced, good characteristics are maintained. Further, a semi-insulating semiconductor has high thermal conductivity. When such a semi-insulating semiconductor is used in the current blocking layer, the heat dissipation of the QCL device is improved, so that high-temperature operations are possible.

In the quantum cascade laser according to the present invention, the buried region may be formed of a semi-insulating semiconductor. In addition, the buried region may be formed of InP or AlInAs doped with at least one of Fe, Ti, Cr, and Co. Since a semi-insulating semiconductor has high resistance to electrons and high thermal conductivity, the semi-insulating semiconductor is suitable for constituting the buried regions. In addition, a semi-insulating semiconductor has a low absorption coefficient for light having a mid-infrared wavelength. Therefore, even when the buried region formed of such a semi-insulating semiconductor is introduced, a waveguide loss is not increased, so that good characteristics are maintained.

In the quantum cascade laser according to the present invention, each of the plurality of core regions preferably includes a plurality of active layers and a plurality of injection layers. The plurality of active layers and the plurality of injection layers may be alternately stacked on the principal surface. Each of the plurality of active layers may emit light. In addition, each of the plurality of injection layers may inject carriers into the plurality of active layers that are adjacent thereto, respectively.

BRIEF DESCRIPTION OF THE DRAWINGS

FIG. 4 shows a table illustrating effects of the quantum cascade laser according to the embodiment.

DESCRIPTION OF THE PREFERRED EMBODIMENTS

Figure 1A:
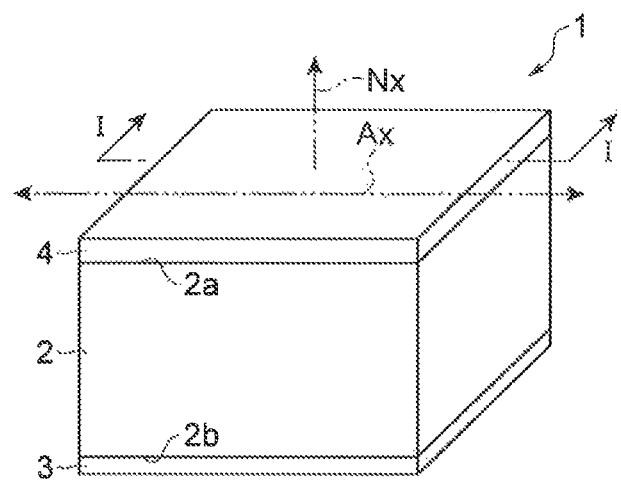
FIGS. 1A and 1B show a structure of a quantum cascade laser according to an embodiment.

Preferred embodiments of the present invention are described in detail below with reference to the drawings. In describing the drawings, if possible, corresponding parts are given the same reference numerals and the same descriptions thereof are not repeated. Quantum cascade lasers (QCLs) according to first to third embodiments below each have a buried heterostructure (hereunder referred to as "BH structure").

First Embodiment

Figure 1B:
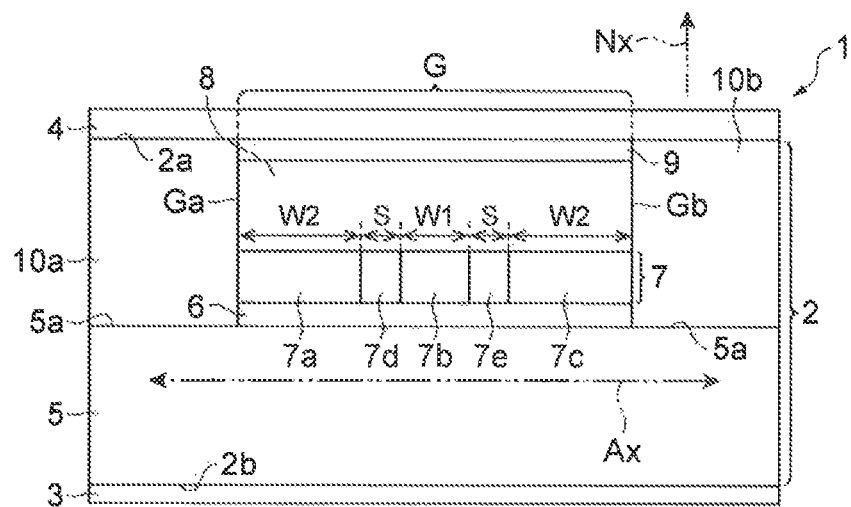

FIGS. 1A and 1B illustrate a quantum cascade laser 1 according to the first embodiment. FIG. 1A illustrates an external shape of the quantum cascade laser 1. FIG. 1B illustrates a cross-section taken along line I-I in FIG. 1A. The quantum cascade laser 1 includes a semiconductor layer 2, a lower electrode 3, and an upper electrode 4. The lower electrode 3 is provided on a back surface 2b of the semiconductor layer 2. The upper electrode 4 is provided on a principal surface 2a of the semiconductor layer 2. The semiconductor layer 2 of the quantum cascade laser 1 includes an n-type semiconductor substrate 5, a mesa waveguide G a current blocking layer 10a, and a current blocking layer 10b. The mesa waveguide G is provided on a principal surface 5a of the n-type semiconductor substrate 5. The lower electrode 3 is provided on a back surface of the n-type semiconductor substrate 5 (that is, the back surface 2b of the semiconductor layer 2 that is disposed opposite to the principal surface 5a). The mesa waveguide G includes an n-type lower cladding layer 6, a light emitting region 7, an n-type upper cladding layer 8, and an n-type contact layer 9. The mesa waveguide G is provided at a central portion of the quantum cascade laser 1 in the reference direction Ax. The reference direction Ax is parallel to the principal surface 5a and is orthogonal to the direction in which the mesa waveguide G extends. That is, the reference direction Ax is parallel to a transverse direction of the mesa waveguide G (hereinafter referred to as "transverse direction"). The reference direction Ax is also orthogonal to a longitudinal direction of the mesa waveguide G (hereinafter referred to as "longitudinal direction").

The quantum cascade laser 1 has a BH structure used to confine a current into the mesa waveguide G. In the BH structure of the quantum cascade laser 1, the current blocking layers 10a and 10b formed of semi-insulating semiconductors are formed on respective sides of the mesa waveguide G. The mesa waveguide G is buried with the current blocking layers 10a and 10b. The current blocking layer 10a is provided on a side surface Ga of the mesa waveguide G. The current blocking layer 10b is provided on a side surface Gb of the mesa waveguide G. The side surfaces Ga and Gb both cross the reference direction Ax. The current blocking layer 10a, the mesa waveguide G, and the current blocking layer 10b are sequentially disposed on the principal surface 5a in the reference direction Ax. An upper surface of the current blocking layer 10a, an upper surface of the mesa waveguide G, and an upper surface of the current blocking layer 10b form one surface (that is, the principal surface 2a of the semiconductor layer 2). The upper electrode 4 is formed on the principal surface 2a.

The n-type upper cladding layer 8 is provided on an upper portion of the light emitting region 7 in the normal direction Nx. The normal direction Nx is orthogonal to the principal surface 5a. The light emitting region 7 is provided between the principal surface 5a and the n-type upper cladding layer 8. The light emitting region 7 has a structure in which a core region is divided into a plurality of core regions. The light emitting region 7 includes the plurality of core regions and a plurality of buried regions. In the embodiment, for example, the quantum cascade laser 1 has three core regions, that is, a first core region 7b and second core regions 7a and 7c. The first core region 7b is disposed at a central portion of the mesa waveguide G in the reference direction Ax. The second core regions 7a and 7c are disposed on respective sides of the first core region 7b in the reference direction Ax. In addition, the quantum cascade laser 1 has two buried regions, that is, a buried region 7d and a buried region 7e. The buried region 7d is disposed between the first core region 7b and second core region 7a. The buried region 7e is disposed between the first core region 7b and second core region 7c.

The second core region 7a, the first core region 7b, and the second core region 7c include semiconductor layers constituting the QCL. The second core region 7a, the first core region 7b, and the second core region 7c are sequentially provided on the principal surface 5a in the reference direction Ax. The second core region 7a and the second core region 7c are provided on the respective sides of the first core region 7b in the reference direction Ax as described above. The second core region 7a is provided on the side surface Ga of the mesa waveguide G. The second core region 7c is provided on the side surface Gb of the mesa waveguide G. The first core region 7b is provided between the second core region 7a and the second core region 7c. The first core region 7b is provided at the central portion of the mesa waveguide G in the reference direction Ax. The buried region 7d and the buried region 7e are sequentially provided on the principal surface 5a in the reference direction Ax. The second core region 7a, the buried region 7d, the first core region 7b, the buried region 7e, and the second core region 7c are alternately provided on the principal surface 5a in the reference direction Ax. In this way, the buried regions are formed between the divided core regions.

The width of the first core region 7b is smaller than the widths of the second core regions 7a and 7c in the reference direction Ax. Preferably, each of the second core regions 7a and 7c in the reference direction Ax has a width W2 in the range of more than 1 times to less than or equal to 1.6 times a width W1 of the first core region 7b in the reference direction Ax. More specifically, in the quantum cascade laser 1, the second core region 7a and the second core region 7c have the same width W2 in the reference direction Ax, and the width W2 is larger than the width W1 of the first core region 7b. The width W2 of each of the second core regions 7a and 7c in the reference direction Ax and the width W1 of the first core region 7b in the reference direction Ax are in the range of 0.5 nm to 10 μm.

The buried region 7d and the buried region 7e have the same width S in the reference direction Ax. The width S of each of the buried regions 7d and 7e in the reference direction Ax is in the range of 0.5 μm to 10 μm.

The n-type semiconductor substrate 5 is described in more detail. The n-type semiconductor substrate 5 is made of, for example, InP. The semiconductor layers constituting the QCL (n-type lower cladding layer 6, the second core region 7a, the first core region 7b, the second core region 7c, the buried region 7d, the buried region 7e, the n-type upper cladding layer 8, the n-type contact layer 9, the current blocking layer 10a, and the current blocking layer 10b) are formed of a semiconductor material having a lattice constant that is close to that of InP. Therefore, the semiconductor layers constituting the QCL have a good crystal quality when the semiconductor layers constituting the QCL are grown on a InP substrate. Since the InP substrate is transparent to light having a mid-infrared wavelength, it is possible to use the InP substrate as the n-type lower cladding layer 6. Therefore, the n-type lower cladding layer 6 may be omitted when the n-type semiconductor substrate 5 is made of InP.

The n-type lower cladding layer 6 and the n-type upper cladding layer 8 are described in more detail. The n-type lower cladding layer 6 and the n-type upper cladding layer 8 are each formed of, for example, n-type InP. As mentioned above, InP is transparent to light having a mid-infrared wavelength. Therefore, each of the n-type lower cladding layer 6 and the n-type upper cladding layer 8 is made of InP. When the n-type lower cladding layer 6 and the n-type upper cladding layer 8 are made of InP, the n-type lower cladding layer 6 and the n-type upper cladding layer 8 having good crystal quality are easily grown on the n-type semiconductor substrate 5 composed of InP. Further, InP has good thermal conductivity. Therefore, when InP is used for each of the n-type lower cladding layer 6 and the n-type upper cladding layer 8, good heat dissipation from the second core region 7a, the first core region 7b, and the second core region 7c is ensured. As a result, the temperature characteristics of the quantum cascade laser (QCL) 1 are improved.

Figure 2:
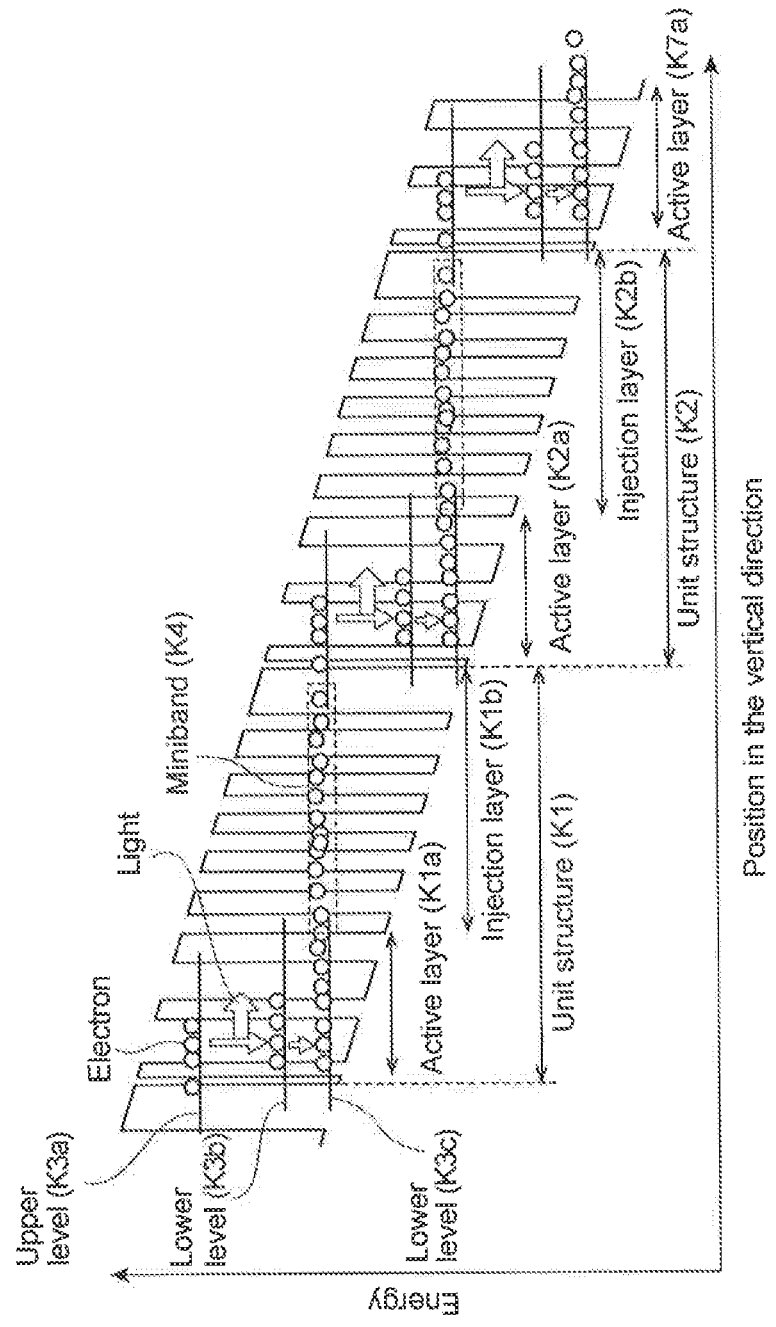
FIG. 2 shows a structure of a core region and an operation of the quantum cascade laser according to the embodiment.

The second core region 7a, the first core region 7b, and the second core region 7c have the same structure except that the width of the first core region 7b differs from that of each of the second core regions 7a and 7c in the reference direction Ax. Therefore, of the structures of the second core region 7a, the first core region 7b, and the second core region 7c, for example, the structure of the second core region 7a is described in more detail. As shown schematically in FIG. 2, the second core region 7a has unit structures that are subjected to multiple connections in several tens of periods. Each of the unit structures of the second core region 7a includes an active layer and an injection layer. Each of the active layers and the injection layers has a super-lattice structure in which quantum well layers K5 and barrier layers K6 are alternately stacked upon each other. Each quantum well layer K5 has a thickness of a few nanometers (nm). Each barrier layer K6 similarly has a thickness of a few nm, and has a band gap energy higher than that of each quantum well layer K5. The vertical axis of FIG. 2 represents conduction band energy. The horizontal axis of FIG. 2 represents position coordinates in the normal direction Nx.

The structure of the second core region 7a is described in more detail with reference to FIG. 2. The second core region 7a includes a plurality of unit structures, such as a unit structure K1 and a unit structure K2. The plurality of unit structures, such as the unit structure K1 and the unit structure K2, have the same structure. The plurality of unit structures are sequentially provided in the normal direction Nx. The unit structure K1 includes an active layer K1a and an injection layer K1b. The unit structure K2 includes an active layer K2a and an injection layer K2b. The active layer K1a, the injection layer K1b, the active layer K2a, the injection layer K2b, and an active layer K7a are sequentially provided in the normal direction Nx (upward direction of the principal surface Sa). For example, the injection layer K1b allows a carrier to be injected into the adjacent active layer K2a. The plurality of active layers, such as the active layer K1a, and the plurality of injection layers, such as the injection layer K1b, each have a super-lattice structure formed of GaInAs/AlInAs.

Next, the light emission principles of the QCL are simply described with reference to FIG. 2. FIG. 2 shows, for example, the structure of the second core region 7a. In the QCL, only electrons are used as carriers. In the QCL, light emission occurs as a result of intersubband electron transition in the conduction band. As shown in FIG. 2, each active layer having a super-lattice structure is provided with three sub-band levels, that is, an upper sub-band level K3a, a lower sub-band level K3b, and a lower sub-band level K3c. As shown in FIG. 2, an electron transport path, which is called a mini band K4, where many sub-band levels are provided close together, is formed in each injection layer by applying an electric field in the core regions.

Here, a voltage is applied between the lower electrode 3 and the upper electrode 4 to generate a predetermined electric field in the core regions, such as the second core region 7a. As shown in FIG. 2, electrons are injected from the n-type upper cladding layer 8 into the upper sub-band level K3a of the active layer K1a at a high potential side for the electrons, and transit to the lower sub-band level K3b. When the electrons transit from the upper sub-band level K3a to the lower sub-band level K3b, light having a wavelength corresponding to the energy difference between these sub-band levels is emitted. Here, the material compositions and thicknesses of the quantum well layers K5 and the barrier layers K6 of the active layer are selected so as to adjust the energy difference between the upper sub-band level K3a and the lower sub-band level K3b. This makes it possible to emit light having a wavelength of a mid-infrared wavelength range of 3 μm to 20 μm.

In order to emit light having the mid-infrared wavelength, GaInAs is used for the quantum well layers K5 and AlInAs is used for the barrier layers K6, for example. When these materials are used in the super-lattice structures of the core region, it is possible to provide a QCL capable of oscillating at the mid-infrared wavelength range of 3 μm to 20 μm.

After transiting from the upper sub-band level K3a to the lower sub-band level K3b, the electrons transit to the lower sub-band level K3c of the active layer K1a at a high speed. The lower sub-level K3c is situated below the lower sub-level K3b. In this transition from the lower sub-band level K3b to the lower sub-band level K3c, L0 phonon is emitted. Then, the electrons move through the injection layer K1b, and are injected into the upper sub-level K3a of the active layer K2a of the unit structure K2 that is adjacent to the unit structure K1. The transition of electrons from the lower sub-band level K3b to the lower sub-band level K3c occurs at a high speed. Therefore, a population inversion of carriers (electron) is efficiently provided between the lower sub-level K3b and the upper sub-level K3a. As a result, a stimulated emission occurs between the upper sub-level K3a and the lower sub-level K3b due to the population inversion, and an optical gain is also obtained. In the injection layer, as shown in FIG. 2, the electrons move through the mini band K4, and are smoothly injected into the next active layer. As in the active layer Kia, the electrons injected into the active layer K2a transit from the upper sub-band level K3a to the lower sub-band level K3b of the active layer K2a. In this transition of electrons, light having the wavelength corresponding to the energy difference between these sub-band levels is also emitted. The electrons then move through the injection layer K2b and are transferred to the active layer K7a of the unit structure that is adjacent to the unit structure K2. Subsequently, a radiative transition with emitting light is repeated in each of the unit structures. The lights emitted in all of the unit structures due to the radiative transition are added so as to generate the output light of the QCL. When an injection current is increased, an optical gain in each active layer is increased. When the optical gain becomes larger than the optical loss of the QCL, laser oscillation occurs.

As shown in FIG. 2, as the core regions, such as the second core region 7a, a structure in which injection layers and active layers are alternately connected is used. By connecting the active layers by the corresponding one of the injection layers, the electrons are smoothly and continuously transferred to the adjacent active layer. As a result, the emission of light resulting from intersubband electron transition in the conduction band occurs efficiently.

In the QCL, only electrons in the conduction band is used for the radiative transition. The emission of light occurs due to the intersubband electron transition in the conduction band. On the other hand, in a conventional semiconductor laser having a p-n junction, the emission of light occurs due to a band-to-band transition of electrons in the conduction band to the valence band, and subsequent recombination of electrons and holes in the valence band. Therefore, the conventional semiconductor laser having a p-n junction emits light on the basis of a principle that is completely different from that on the basis of which the quantum cascade laser 1 emits light.

Referring back to FIGS. 1A and 1B, the current blocking layers 10a and 10b are described in more detail. The current blocking layers 10a and 10b have the same structure. Therefore, as an example, the structure of the current blocking layer 10a will be described in detail. The current blocking layer 10a is formed of a semi-insulating semiconductor such as Fe-doped InP. The semi-insulating semiconductor has a large resistance for electrons. Consequently, the semi-insulating semiconductor is suitable as a material of the current blocking layer 10a. Thus, by using the semi-insulating semiconductor for the current blocking layer 10a, it is possible to confine a current (carrier) into the mesa waveguide G.

As a semi-insulating semiconductor used for the current blocking layer 10a, for example, a III-V group compound semiconductor (first semiconductor) doped with any one of transition metals, such as Fe, Ti, Cr, and Co, may be used. These transition metals form a deep level that traps electrons in a semiconductor forbidden band. That is, such a semiconductor has a semi-insulating property as a result of trapping electrons in a deep level. In particular, Fe is generally used as a dopant for obtaining the semi-insulating semiconductor. The III-V group compound semiconductor such as InP and AlInAs has a semi-insulating property by doping any one of the transition metals, such as Fe, Ti, Cr, and Co into the III-V group compound semiconductor. The semi-insulating semiconductor doped with any one of these transition metals has a large electrical resistivity of, for example, 10' (Ccm) or higher with respect to electrons.

For example, semi-insulating InP and AlInAs doped with any one of the transition metals, such as Fe, Ti, Cr, and Co, are lattice-matched to the n-type semiconductor substrate 5 made of InP. Therefore, the semi-insulating InP and AlInAs doped with any one of the transition metals, such as Fe, Ti, Cr, and Co are grown on the n-type semiconductor substrate 5 so as to achieve a good crystal quality.

Further, III-V group compound semiconductors, such as semi-insulating InP and AlInAs, doped with any one of the transition metals, such as Fe, Ti, Cr, and Co, have a low absorption coefficient for light having the mid-infrared wavelength. Therefore, even when any one of these semi-insulating semiconductors is used for the current blocking layer 10a, waveguide loss based on the light absorption does not increase. Consequently, even when a current blocking layer formed of a III-V group compound semiconductor, such as semi-insulating InP or AlInAs, doped with any one of the transition metals, such as Fe, Ti, Cr, and Co, is introduced, it is possible to maintain good QCL characteristics.

In addition, III-V group compound semiconductors, such as semi-insulating InP and AlInAs, doped with any one of the transition metals, such as Fe, Ti, Cr, and Co, have high thermal conductivity. Therefore, by using such a semi-insulating semiconductor for the current blocking layer 10a, heat dissipation of a QCL device is improved, so that a high-temperature operation is possible. Since InP has a particularly high thermal conductivity, it can be suitably used for the current blocking layer 10a.

However, AlInAs may also be used for the current blocking layer 10a. The band gap energy of AlInAs is larger than that of InP. Therefore, by using AlInAs for the current blocking layer 10a, a larger energy barrier with respect to electrons is formed at an interface between the current blocking layer 10a and each layer (that is, the n-type lower cladding layer 6, the light emitting region 7, the n-type upper cladding layer 8, and the n-type contact layer 9) of the adjacent mesa waveguide G compared to that when InP is used. Therefore, in addition to the large resistance of the semi-insulating AlInAs, the effect of the large energy barrier makes it possible to suppress the flowing of electrons into the current blocking layer 10a from the mesa waveguide G. Thus, the current blocking layer 10a made of semi-insulating AlInAs has larger resistance for the electrons. Consequently, electric current is further confined in the mesa waveguide G by using the current blocking layer 10a made of semi-insulating AlInAs.

The buried regions 7d and 7e are described in more detail. The buried regions 7d and 7e have the same structure. Therefore, as an example, the structure of the buried region 7d will be described in detail. Electric current to the second core region 7a, the first core region 7b, and the second core region 7c needs to be confined. Therefore, as with, for example, the current blocking layer 10a, the buried region 7d also needs to have a large resistance for carriers (electrons). Consequently, as with, for example, the current blocking layer 100a, it is suitable to use a semi-insulating III-V group compound semiconductor (second semiconductor), such as InP or AlInAs, which is doped with any one of the transition metals, such as Fe, Ti, Cr, and Co. In particular, Fe is generally used as a dopant for the semi-insulating III-V group compound semiconductor.

As mentioned above, a semi-insulating III-V group compound semiconductor, such as InP or AlInAs, doped with a transition metal, such as Fe, has a low absorption coefficient for light having the mid-infrared wavelength. Therefore, even when such a semi-insulating III-V group compound semiconductor is used for the buried region 7d, waveguide loss is not increased. Further, such a semi-insulating III-V group compound semiconductor doped with a transition metal, such as Fe, has good heat transfer characteristics, and is suitable as a material of the buried region 7d. In particular, InP has high thermal conductivity, and is easily grown on the semiconductor substrate 5 composed of InP. Therefore, InP is suitable as a semiconductor of the buried region 7d.

However, AlInAs may also be used for the buried region 7d. The band gap energy of AlInAs is larger than that of InP. Therefore, by using AlInAs for the buried region 7d, the resistance of the buried region 7d for electrons is larger than that when InP is used. Consequently, it is possible to enhance the confinement of a current into the core regions, such as the second core region 7a.

Next, the n-type contact layer 9, the lower electrode 3, and the upper electrode 4 are described. The n-type contact layer 9 is provided for making a good ohmic contact with the upper electrode 4. For example, the n-type contact layer 9 is made of n-type GaInAs. The lower and upper electrodes 3 and 4 are made of, for example, Ti/Au or Ge/Au.

In addition to the structure shown in FIGS. 1A and 1B, the quantum cascade laser 1 may include optical confinement regions at the upper and lower sides of the core regions, such as the second core region 7a, if necessary. The optical confinement regions enhance the confinement of light into the core regions. In this case, from the viewpoint of increasing heat dissipation at the core regions, a region including the core regions and the optical confinement regions is divided into a plurality of regions in the reference direction Ax which is parallel to a transverse direction. It is desirable that buried regions having high resistance and good thermal conductivity are formed between the divided regions. However, optical confinement regions may be not divided. The optical confinement regions are formed of materials having refractive indices that are less than those of the active layers and larger than those of the cladding layers. The optical confinement regions are formed of, for example, undoped or n-type GaInAs. Regarding the n-type contact layer 9, when the upper cladding layer 8 having a good ohmic contact with the upper electrode 4 is formed, the contact layer may be omitted. In addition, when the substrate is formed of a material (such as InP) that is transparent to light emitted from the active layers and has a lower refractive index than that of the active layer, the substrate functions as the lower cladding layer. In this case, the n-type lower cladding layer 6 need not be provided as described above. As an n-type dopant for forming each of the n-type semiconductor layers according to the embodiment, for example, Si, S, Sn, or Se is used.

Next, a calculation regarding core temperature using a specific example of the quantum cascade laser 1 according to the first embodiment is performed. Using the results of the calculation, structural improvements of the quantum cascade laser 1 according to the first embodiment over conventional structures are described.

In the embodiment, a core region of the light emitting region is divided into three regions, that is, the first core region and the two second core regions. The first core region is disposed at a central portion of the quantum cascade laser 1 in the reference direction Ax. The second core regions are disposed on respective sides of the first core region in the reference direction Ax and have the same width. The width of the first core region in the transverse direction (corresponding to the reference direction Ax) is defined as W1, the width of each of the second core regions in the transverse direction is defined as W2, and the width of each of buried regions between the corresponding core regions in the transverse direction is defined as S. The specific structure of each region is as follows, in which, hereunder, the term "thickness" means the thickness of each region in a direction perpendicular to the principal surface of the semiconductor substrate:

Substrate: n-InP, thickness=100 µm;
Lower cladding layer: n-InP, thickness=0.5 µm;
Core regions: light emission wavelength=7.8 µm, AlInAs/GaInAs super-lattice structures, thickness=1.4337 µm;
Upper cladding layer: n-InP, thickness=3 µm;
Contact layer: n-GaInAs, thickness=0.1 µm;
Buried regions: InP doped with Fe, thickness=1.4337 µm (same as those of the core regions); and
Current blocking layers: InP doped with Fe, thickness=5.0337 µm (same as the height of mesa waveguide).

It is assumed that the substrate is provided on a heat sink whose temperature is regulated at a constant temperature of 300 K. Therefore, it is also assumed that the temperature of the back surface of the substrate is constant at 300 K. As an example, calculations are performed using a two-dimensional thermal analysis program to find out a dependence of a difference (Tavg_1−Tavg_2) between an average temperature (Tavg_1) of the first core region and an average temperature (Tavg_2) of each second core region on a core division ratio (W2/W1) between the first core region and each of the second core regions. It is assumed that a constant driving power of 25 W is applied to the QCL. In order to evaluate the correlation between the core division ratio (W2/W1) and the difference between the average temperatures of the core regions, the applied power per unit volume of the core regions is made constant. Therefore, the total of the widths of the first core region and the second core regions (W1+W2×2) is assumed to be constant at 10 µm. The width (S) of the buried regions is set to be in the range of approximately 0.5 µm to 10 µm as mentioned below. In this structure including the buried regions having the width (S) of approximately 0.5 µm to 10 µm, the divided core regions are optically coupled with each other through the buried regions so as to generate a single waveguiding mode in the mesa waveguide G. Therefore, the width (S) of the buried regions is selected from four values, 0.5 µm, 1 µm, 2 µm, and 3 µm. A cavity length in the longitudinal direction of the mesa waveguide G is constant at 2 mm.

Figure 3:
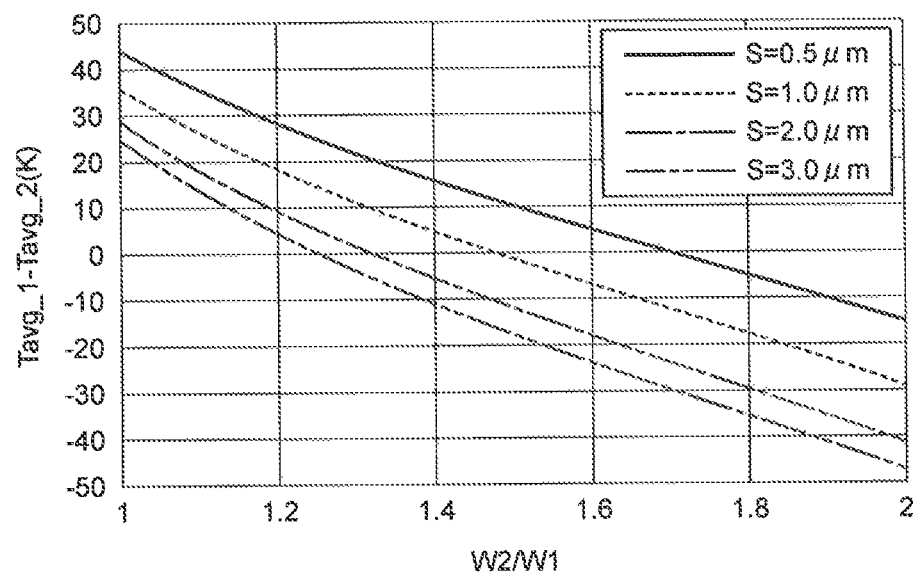
FIG. 3 shows a graph illustrating the dependence of the difference (Tavg_1−Tavg_2) between the average temperatures of the core regions on the core division ratio (W2/W1) for the quantum cascade laser according to the embodiment.

The results of calculation of the dependence of the difference (Tavg_1−Tavg_2) between the average temperatures of the core regions (that is, the average temperature Tavg_1 of the first core region and the average temperature Tavg_2 of each of the second core regions) on the core division ratio (W2/W1) between the first core region and each of the second core regions in the range of the division ratio (W2/W1) of 1 to 2 are shown in FIG. 3. The vertical axis of FIG. 3 represents the difference (Tavg_1−Tavg_2) between the average temperatures of the core regions. The horizontal axis of FIG. 3 represents the W2/W1 value. FIG. 3 shows that the difference between the average temperatures of the core regions substantially similarly changes with respect to the division ratio (W2/W1) between the core regions independently of the S value.

From the results, first, as the core division ratio (W2/W1) is increased, that is, as the width (W1) of the first core region is reduced and the width (W2) of each second core region is increased, the difference between the average temperatures of the first and second core regions is reduced. Further, it is understood that, at a certain core division ratio (W2/W1) in the range of 1 to 2, the difference between the average temperatures of the first and second core regions is 0, that is, the average temperatures of the first and second core regions are the same. Further, when the core division ratio (W2/W1) is increased, the temperature of each second core region is higher than that of the first core region, so that the difference between the average temperatures becomes negative.

In the aforementioned calculation results, when the core division ratio (W2/W1) is increased, the difference between the temperatures of the first and second core regions is reduced due to the following reason. It is to be noted that, since the calculations are performed with the total of the widths (W1, W2) of the first core region and the second core regions being a constant value at 10 µm, the width (W2) of each second core region increases due to the reduction in the width (W1) of the first core region. Therefore, when the width (W1) of the first core region is reduced, the width (W2) of each second core region is increased as a result of the reduction in the width (W1) of the first core region. First, the width (W1) of the first core region is reduced, and heat dissipation in the first core region in the transverse direction is improved. As a result, the temperature of the first core region is reduced. In addition, as a result of the increase in the width (W2) of each second core region and a reduction in heat dissipation in the second core region in the transverse direction, the temperature of each second core region is increased. Therefore, by the increase in the core division ratio (W2/W1), the temperature difference between the first and second core regions is reduced.

In conventional structures in which the core division ratio (W2/W1) is 1, that is, the first and second core regions are divided with the same width, the average temperature of the first core region is higher than that of each second core region, with the average temperature exceeding 20K. In other words, in the conventional structures in which the core regions are divided by a uniform width, the temperature of the first core region at the central portion of the QCL device is higher than that of each of the second core regions at the peripheral portions. Even if the widths of the core regions are the same, a heat transfer path (used for transferring heat to the outside) of the first core region positioned close to the central portion is longer than those of the second core regions positioned close to the peripheral portions. Therefore, heat dissipation in the transverse direction is poor and the heat tends to be confined. Consequently, the temperature of the first core region at the central portion of the QCL device is higher than the temperature of each of the second core regions at the peripheral portions. When such a temperature distribution occurs between the core regions, the optical gain of the QCL at the oscillation wavelength is reduced as mentioned above. As a result, oscillation characteristics of the QCL are deteriorated, for example, threshold current is increased and an oscillation mode becomes unstable.

In contrast, the structure according to the embodiment is designed so that the width of each core region (second core region) at the peripheral portion becomes larger than the width of the core region (first core region) at the central portion, that is, so that W2/W1>1. Therefore, the temperature difference between the core regions may be made smaller than those in the conventional structures. As a result, the reduction in the optical gain caused by the temperature difference between the core regions is mitigated or prevented. Therefore, it is possible to achieve good QCL characteristics.

Next, the results of consideration of the range of the core division ratio (W2/W1), where the temperature difference between the core regions can be lower than those in the conventional structures are summarized in FIG. 4. An average temperature difference ΔTavg between the first core region and each second core region in conventional structures where the core division ratio (W2/W1) is 1 and the core division ratio (W2/W) range where the average temperature difference ΔTavg can be made lower than those in the conventional structures are summarized with respect to each width (S) value of the buried regions. In FIG. 4, the average temperature difference ΔTavg is represented by an absolute value (ΔTavg=|Tavg_1−Tavg_2|). As the width (S) of the buried regions is increased, the range of the core division ratio (W2/W1) where the temperature difference can be lower than those in the conventional structures is narrowed. However, if the range of the core division ratio (W2/W1) is greater than 1 and less than 1.6, the temperature difference between the first and second core regions is lower than those in the conventional structures for any width (S). Therefore, in order to reduce the temperature difference between the core regions, the core division ratio (W2/W1) is preferably greater than 1 and less than 1.6.

Figure 5:
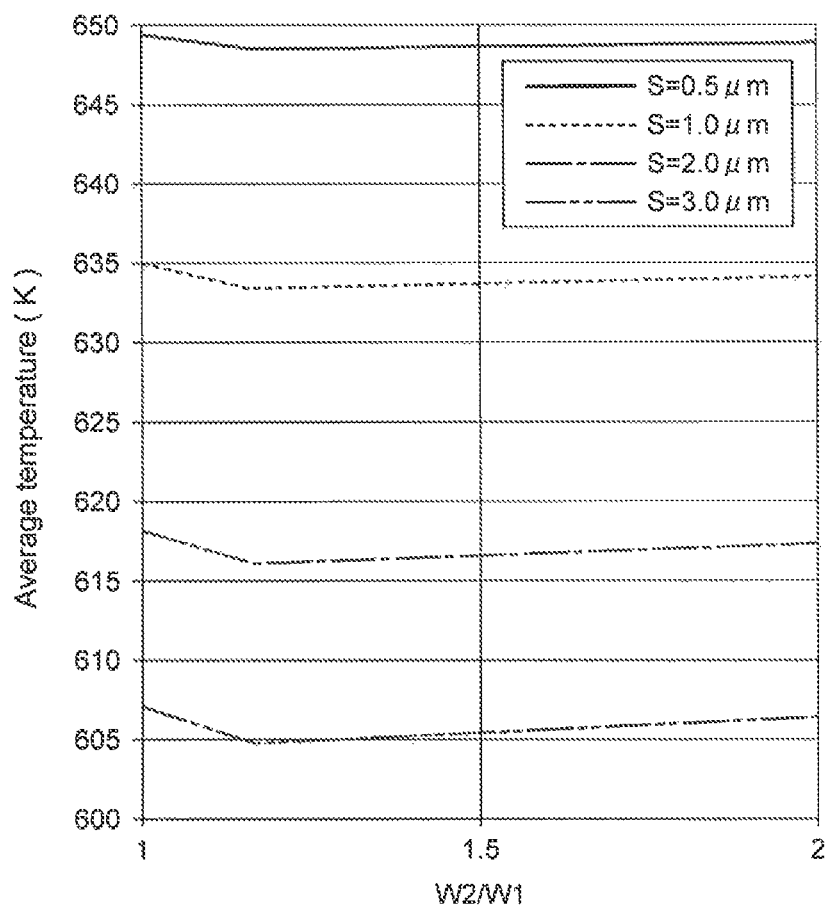
FIG. 5 shows a graph illustrating the correlation between the core division ratio (W2/W1) and the average temperature of the core regions as a whole for the quantum cascade laser according to the embodiment.

Next, with the width S of each buried region being a parameter, the results of the correlation between the core division ratio (W2/W1) and the average temperature of the core regions as a whole (that is, the temperature obtained by a weighted average of the average temperature of the first core region and the average temperature of each second core region using the volume of each core region) are shown in FIG. 5. The vertical axis of FIG. 5 represents the average temperature of the core regions as a whole. The horizontal axis of FIG. 5 represents the W2/W1 value.

As shown in FIG. 5, in the range in which the core division ratio (W2/W1) is greater than 1 and less than 1.6, the average temperature of the core regions as a whole is also lower than those in the conventional structures in which the core division ratio (W2/W1) is 1. In the range in which the core division ratio (W2/W1) is greater than 1 and less than 1.6, the average temperature difference ΔTavg between the first and second core regions is lower than those in the conventional structures in which the core division ratio (W2/W1) is 1. As the temperatures of the core regions are reduced, the optical gain at the oscillation wavelength is increased, so that QCL characteristics are improved; for example, threshold current is reduced and quantum efficiency is improved. Consequently, when the core division ratio (W2/W1) is in the range that is greater than 1 and less than 1.6, compared to the conventional structures, the temperature difference between the core regions is lower and the average temperature of the core regions as a whole is also lower. Thus, compared to the conventional structures, the optical gain at the oscillation wavelength is larger. As a result, it is possible to significantly improve the oscillation characteristics of the QCL. In addition, even if the core division ratio (W2/W1) is the same, the average temperature is reduced with increasing the width (S) of the buried regions. Therefore, when the width (S) of the buried regions is made large, QCL characteristics are further improved.

As the width (S) of the buried regions is increased, an area of the buried regions having good thermal conductivity is increased. As a result, heat dissipation from the core regions is increased. Therefore, in the range in which the divided core regions are optically coupled with each other and a single QCL waveguiding mode is generated, the width (S) of the buried regions is preferably set as large as possible.

Lastly, a suitable range of the widths of the core regions in the transverse direction and a suitable range of the widths of the buried regions in the transverse direction in the divided core region will be described. The divided-core structure according to the embodiment is formed by the following steps. First, after forming a core region on the entire surface of a substrate, unrequired portions of the core region (portions that become buried regions) are removed by dry etching or wet etching to divide the core region into three core regions. Thereafter, buried regions are regrown in gaps formed by etching unrequired core regions.

If the width of each divided core region is less than 0.5 µm, it is difficult to ensure reproducibility of such narrow core regions in the etching process. Therefore, it is desirable that the width of each divided core region is greater than or equal to 0.5 µm. In contrast, if the width of each divided core region is excessively large, it is difficult to achieve stable oscillation in a fundamental mode and high-temperature operation. Therefore, it is desirable that the width of each divided core region is less than or equal to 10 µm. Consequently, it is desirable that the width of each divided core region is in the range of approximately 0.5 µm to 10 µm.

If the width of each buried region is less than 0.5 µm, for example, abnormal growth occurs during regrowth of the buried regions. Therefore, the lower limit of the width of each buried region is approximately 0.5 µm. In contrast, the divided core regions are optically coupled with each other through the buried regions to generate a single waveguiding mode. Therefore, the width of each buried region is set to be less than or equal to approximately 10 µm. Therefore, it is desirable that the width of each buried region is in the range of approximately 0.5 µm to 10 µm.

In the foregoing description, the number of divided core regions is three. However, the number of divided core regions is not limited to three. Other numbers of divided core regions, such as an arbitrary number of divided core regions of four or more, provide similar improvements. For any of the numbers of divided core regions, when the widths of the core regions at the peripheral portions are larger than the width of the core region at the central portion, it is possible to decrease the temperature difference between the core regions compared to the temperature difference in conventional structures.

In addition, it is possible to also reduce the average temperature of the core regions as a whole. As a result, a high optical gain is obtained, and better QCL characteristics are obtained.

Second Embodiment

In the first embodiment, the buried regions made of a semi-insulating semiconductor are formed in only the light emitting region. In the embodiment, the buried regions are extended from the light emitting region toward outside in the normal direction of the principal surface of the n-type semiconductor substrate and in a direction opposite to the normal direction so as to protrude from the light emitting region.

Figure 6A:
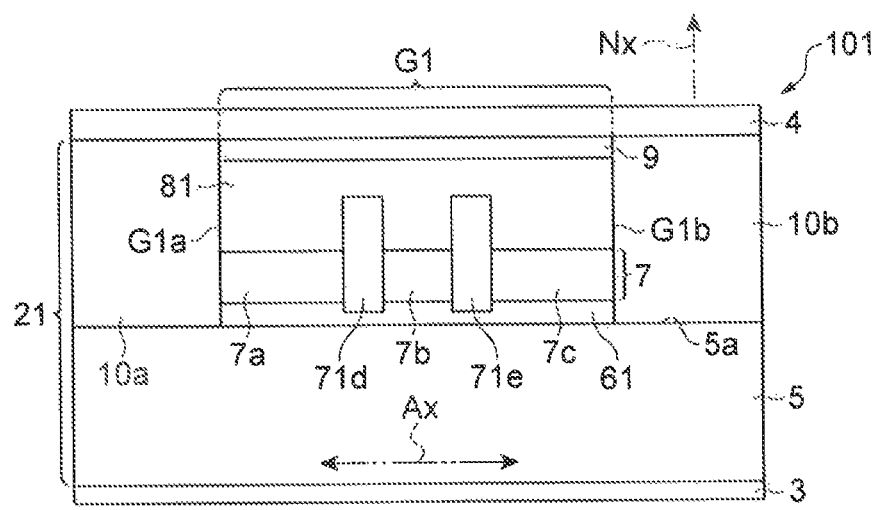
FIGS. 6A and 6B show structures of other quantum cascade lasers according to an embodiment.

In a quantum cascade laser 101 shown in FIG. 6A, buried regions (buried regions 71*d* and 71*e*) are extended from a light emitting region 7 to middle portions of upper and lower cladding layers (an n-type lower cladding layer 61 and an n-type upper cladding layer 81. Alternatively, as in a quantum cascade laser 102 shown in FIG. 6B, buried regions (buried regions 72*d* and 72*e*) may be extended from a light emitting region 7 to a substrate 5 through the lower cladding layer (an n-type lower cladding layer 62) and to an n-type contact layer 9 through the upper cladding layer (an n-type upper cladding layer 82). In the quantum cascade laser 101 and the quantum cascade laser 102, the buried regions are extended into both of the upper and lower cladding layers. However, the buried regions may be extended into a middle portion of only one of the cladding layers. Alternatively, the buried regions may be extended through the one of the cladding layers.

The quantum cascade laser 101 includes a semiconductor layer 21. The semiconductor layer 21 includes a mesa waveguide G1. The mesa waveguide G1 includes the buried region 71*d* and the buried region 71*e*. The mesa waveguide G1 also includes the n-type upper cladding layer 81 and the n-type lower cladding layer 61. A current blocking layer 10*a* is provided on a side surface G1*a* of the mesa waveguide G1. A current blocking layer 10*b* is provided on a side surface G1*b* of the mesa waveguide G1. The buried region 71*d* and the buried region 71*e* are extended to a middle portion of the n-type upper cladding layer 81 and to a middle portion of the n-type lower cladding layer 61. In this way, the quantum cascade laser 1 and the quantum cascade laser 101 differ only in the forms of the buried regions.

The quantum cascade laser 102 includes a semiconductor layer 22. The semiconductor layer 22 includes a mesa waveguide G2. The mesa waveguide G2 includes the buried region 72*d* and the buried region 72*e*. The mesa waveguide G2 also includes the n-type upper cladding layer 82 and the n-type lower cladding layer 62. A current blocking layer 10*a* is provided on a side surface G2*a* of the mesa waveguide G2. A current blocking layer 10*b* is provided on a side surface G2*b* of the mesa waveguide G2. The buried region 72*d* and the buried region 72*e* are extended through the n-type upper cladding layer 82 and reach an n-type contact layer 9. The buried region 72*d* and the buried region 72*e* are also extended through the n-type lower cladding layer 62 and reach an n-type semiconductor substrate 5. In this way, the quantum cascade laser 1 and the quantum cascade laser 102 differ only in the forms of the buried regions.

Figure 7A:
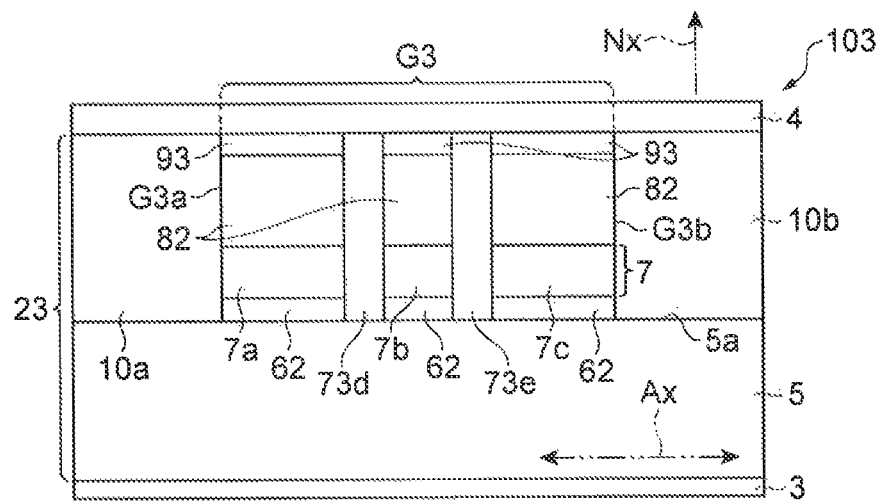
FIGS. 7A and 7B show structures of other quantum cascade lasers according to the embodiment.
Figure 7B:
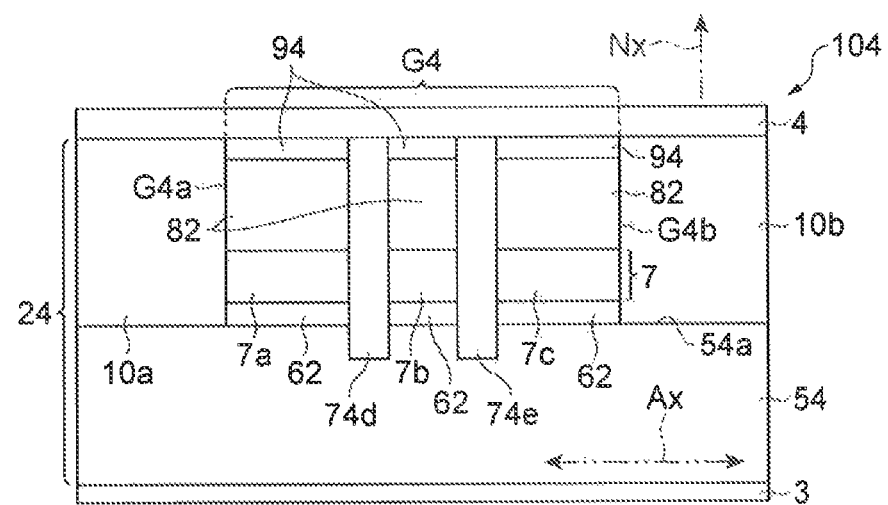

As shown in FIG. 7A, buried regions (buried regions 73*d* and 73*e*) in a quantum cascade laser 103 may be extended from a principal surface 5*a* of an n-type semiconductor substrate 5 to an upper electrode 4 through an n-type lower cladding layer 62, a light emitting region 7, an n-type upper cladding layer 82, and an n-type contact layer 93. Alternatively, as shown in FIG. 7B, buried regions (buried regions 74*d* and 74*e*) in a quantum cascade laser 104 may be extended from a middle portion of a substrate (n-type semiconductor substrate 54) to an upper electrode 4 through an n-type lower cladding layer 62, a light emitting region 7, an n-type upper cladding layer 82, and an n-type contact layer 94. A portion indicated by reference numeral 54*a* in FIG. 7B corresponds to a principal surface of the n-type semiconductor substrate 54.

The quantum cascade laser 103 includes a semiconductor layer 23. The semiconductor layer 23 includes a mesa waveguide G3. The mesa waveguide G3 includes the buried region 73*d* and the buried region 73*e*. The mesa waveguide G3 also includes the n-type upper cladding layer 82 and the n-type lower cladding layer 62. A current blocking layer 10*a* is provided on a side surface G3*a* of the mesa waveguide G3. A current blocking layer 10*b* is provided on a side surface G3*b* of the mesa waveguide G3. The buried region 73*d* and the buried region 73*e* are extended from the principal surface 5*a* of the n-type semiconductor substrate 5 to the upper electrode 4 through the n-type lower cladding layer 62, the light emitting region 7, the n-type upper cladding layer 82, and the n-type contact layer 93. In this way, the quantum cascade laser 1 and the quantum cascade laser 103 differ only in the forms of the buried regions.

The quantum cascade laser 104 includes a semiconductor layer 24. The semiconductor layer 24 includes a mesa waveguide G4. The mesa waveguide G4 includes the buried region 74*d* and the buried region 74*e*. The mesa waveguide G4 also includes the n-type upper cladding layer 82 and the n-type lower cladding layer 62. A current blocking layer 10*a* is provided on a side surface G4*a* of the mesa waveguide G4. A current blocking layer 10*b* is provided on a side surface G4*b* of the mesa waveguide G4. The buried regions 74*d* and 74*e* are extended from the middle portion of the n-type semiconductor substrate 54 to the upper electrode 4 through the n-type lower cladding layer 62, the light emitting region 7, the n-type upper cladding layer 82, and the n-type contact layer 94. In this way, the quantum cascade laser 1 and the quantum cascade laser 104 differ only in the forms of the buried regions.

In the second embodiment, the widths of the core regions at the peripheral portions are larger than the width of the core region at the central portion. Therefore, as in the first embodiment, QCL characteristics are improved. In the second embodiment, the buried regions are extended to regions other than the light emitting region. The buried region is made of, for example, a semi-insulating semiconductor such as Fe-doped InP. Therefore, the resistance between the divided core regions becomes higher as compared to the structure according to the first embodiment. As a result, the insulation property between the divided core regions is improved. Leakage current that flows between the core regions may be reduced. In the second embodiment, it is possible to further improve QCL characteristics; for example, threshold current is further reduced.

Third Embodiment

In each of the first and second embodiments above, as a current confinement structure, the QCL device includes a BH structure including current blocking layers formed of a semi-insulating semiconductor such as Fe-doped InP. However, the current confinement structure is not limited thereto. For example, in a quantum cascade laser 105 shown in FIG. 8, an insulating film 1a and an insulating film 11b are formed on side surfaces Ga and Gb of a mesa waveguide G, respectively as the current confinement structure.

Figure 8:
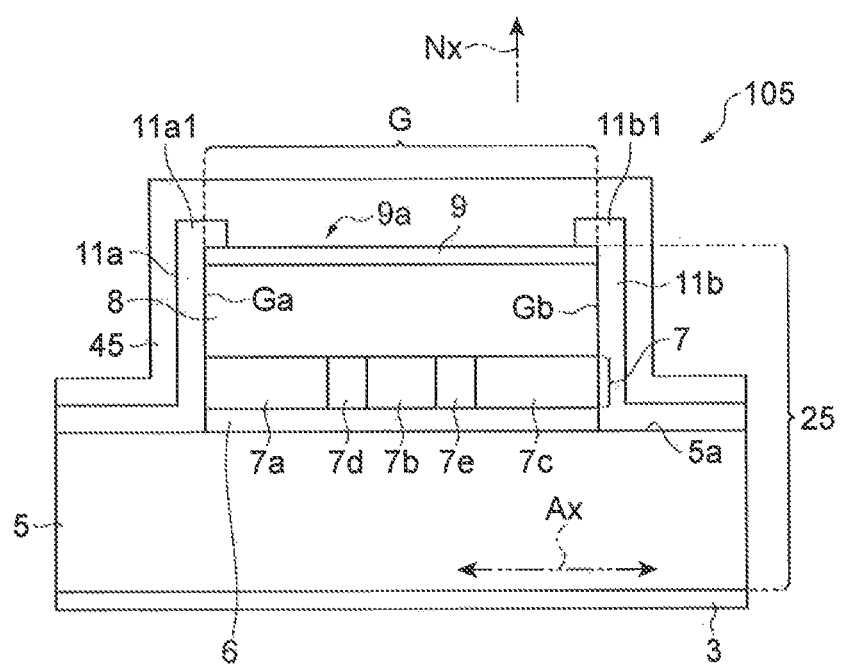
FIG. 8 shows a structure of other quantum cascade laser according to an embodiment.

The quantum cascade laser 105 shown in FIG. 8 includes a semiconductor layer 25. The semiconductor layer 25 includes an n-type semiconductor substrate 5 and a mesa waveguide G. However, the semiconductor layer 25 does not include the current blocking layers 10a and 10b that the semiconductor layer 2 includes in the first embodiment. The insulating films 11a and 11b are each another example of the current blocking layer. The insulating films 11a and 11b may each be formed of, for example, a dielectric film (such as a $SiO_2$, SiON, SiN, or alumina dielectric film) or a resin material (such as benzocyclobutene (BCB) resin or polyimide resin). The insulating film 11a includes an edge portion 11a1. The insulating film 11b includes an edge portion 11b1. The edge portions 11a1 and 11b1 are provided on a surface of an n-type contact layer 9. The edge portion 11a1 is superposed upon a portion of an edge of the surface of the n-type contact layer 9. The edge portion 11b1 is superposed upon a portion of an edge of the surface of the n-type contact layer 9. By the edge portions 11a1 and 11b1, an opening 9a is defined on the surface of the n-type contact layer 9. The surface of the n-type contact layer 9 is exposed via the opening 9a.

The aforementioned dielectric films have hitherto been generally used as protective films of a semiconductor device, and have a good insulating property. The dielectric films are easily formed using a general deposition method such as a sputtering method and a CVD method. The resin layers are easily formed using, for example, a spin coat method. The quantum cascade laser 105 includes an upper electrode 45. The upper electrode 45 is formed on the insulating film 11a, the insulating film 11b, and the n-type contact layer 9. The upper electrode 45 is in direct contact with the surface of the n-type contact layer 9 via the opening 9a. The upper electrode 45 covers the surface of the n-type contact layer 9.

In the third embodiment, the widths of core regions at peripheral portions are larger than the width of a core region at a central portion. Therefore, as in the first embodiment, QCL characteristics are improved. In the current confinement structure of the QCL device in the third embodiment, dielectric films or resins differing from a semiconductor are used as materials of the current blocking layers. Therefore, it is not necessary to grow current blocking layers by using epitaxial growth method. Consequently, compared to the production process of the QCL device in each of the first and second embodiments using semiconductor for the current blocking layers, the production process of the QCL device in the third embodiment may be simplified.

Figure 6B:
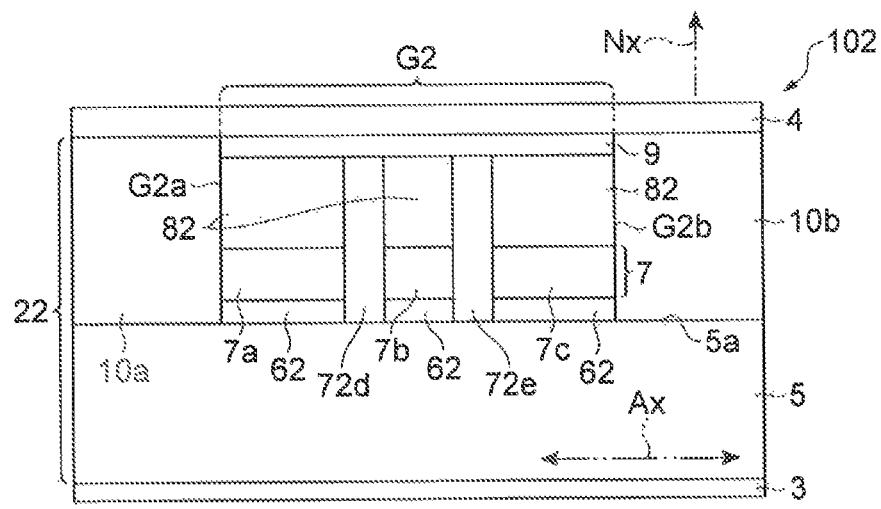
Figure 9A:
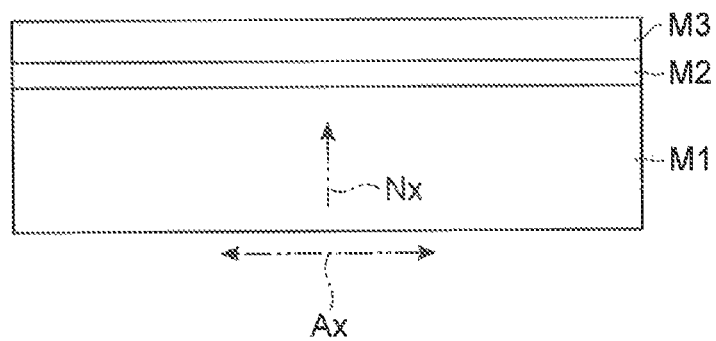
FIGS. 9A, 9B, and 9C show a method for producing the quantum cascade lasers according to the embodiments.

Next, methods for producing the quantum cascade laser 1 shown in FIGS. 1A and 1B, the quantum cascade laser 101 shown in FIG. 6A, the quantum cascade laser 102 shown in FIG. 6B, the quantum cascade laser 103 shown in FIG. 7A, and the quantum cascade laser 104 shown in FIG. 7B will be described. First, the method for producing the quantum cascade laser 1 shown in FIGS. 1A and 1B is described with reference to FIGS. 9A to 12B. FIGS. 9A to 15 show cross sections as seen from a plane that is parallel to the normal direction Nx and the reference direction Ax. First, as shown in FIG. 9A, in a first growth, an n-type lower cladding layer M2 is grown on an n-type semiconductor substrate M1, and a core region M3 (light emitting region) is grown on the n-type lower cladding layer M2.

Figure 9B:
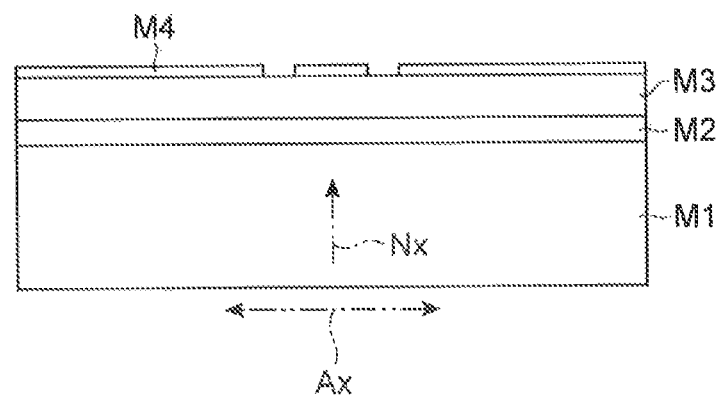

Next, as shown in FIG. 9B, by using photolithography method, a mask M4 for forming divided cores (three division structure in the embodiment) is formed on the core region M3. As crystal growth equipment, for example, an organometallic vapor-phase epitaxy (OMVPE) equipment or molecular beam epitaxy (MBE) equipment is used. The mask M4 is formed of a dielectric film such as a SiN, SiON, or $SiO_2$ film.

Figure 9C:
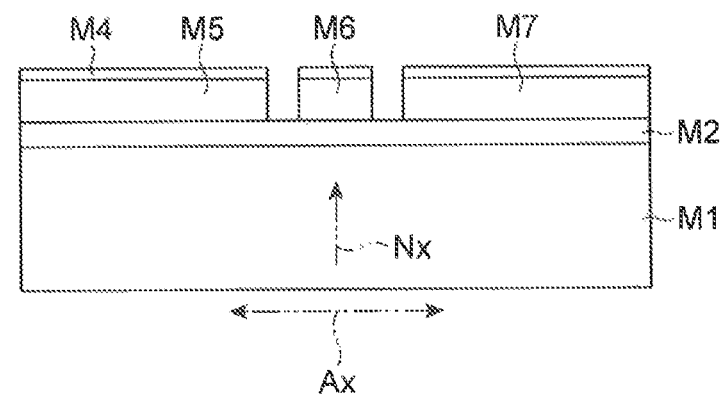

Next, using the mask M4, the core region M3 is etched by wet etching or dry etching. This etching is made until the n-type lower cladding layer M2 is exposed. As shown in FIG. 9C, the core region M3 is divided into three regions, that is, a first core region M6 and second core regions M5 and M7 on respective sides of the first core region M6.

Figure 10A:
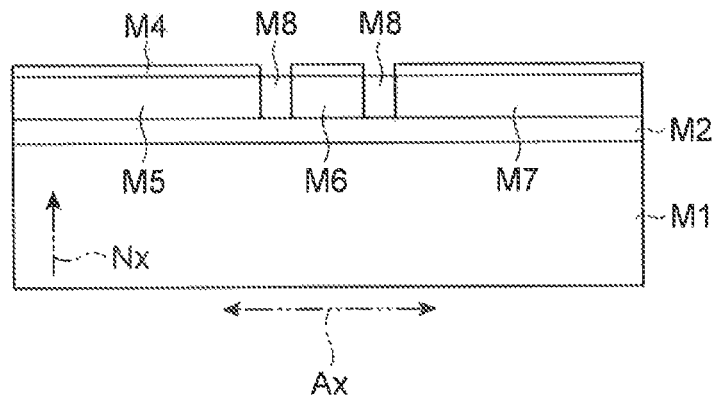
FIGS. 10A, 10B, and 10C show the method for producing the quantum cascade lasers according to the embodiments.

Next, in a second growth, with the mask M4 being provided, semi-insulating semiconductor layers, such as Fe-doped InP layers, are selectively grown on the n-type lower cladding layer M2. As shown in FIG. 10A, two gaps formed by etching the core region M3 (that is, the gap between the second core region M5 and the first core region M6 and the gap between the first core region M6 and the second core region M7) are completely buried with the semi-insulating semiconductor layers. The semi-insulating semiconductor layer is not grown on the mask M4. After the second growth, two buried regions M8 formed of semi-insulating semiconductor having high resistance are formed.

In the embodiment, the core region M3 is etched and divided. However, the structure is not limited thereto. As shown in FIGS. 6A, 6B, 7A, and 7B in the second embodiment, divided structures may be formed so as to include not only the core region M3. That is, they may further include the n-type lower cladding layer M2 and the n-type semiconductor substrate M1 (bottommost portion of the divided structure), or they may even further include an n-type upper cladding layer M9 and an n-type contact layer M10 (topmost portion of the divided structure). These divided structures may be produced using a method that is similar to the production method shown in FIGS. 9A to 10A. That is, first, in a first growth, a stacked semiconductor layer for constituting the divided structure is grown on the n-type semiconductor substrate M1. The stacked semiconductor layer includes the n-type lower cladding layer M2, the core region M3, the n-type upper cladding layer M9, and the n-type contact layer M10, for example. Then, a mask is formed on a top surface of the stacked semiconductor layer, and the stacked semiconductor layer is etched up to a region that becomes the bottommost portion of the divided structure. Thereafter, in a second growth, semi-insulating semiconductor layers are grown in gaps between the divided regions formed by etching. Similarly, after the second growth, buried regions are formed as mentioned above.

Figure 10B:
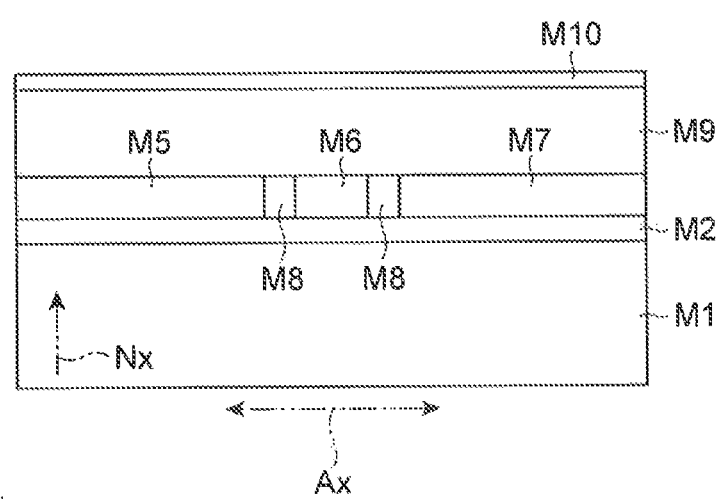

Next, the mask M4, which is a dielectric mask, is removed. As shown in FIG. 10B, in a third growth, the n-type upper cladding layer M9 and the n-type contact layer M10 are grown on the second core region M5, the first core region M6, the second core region M7, and the buried regions M5.

Figure 10C:
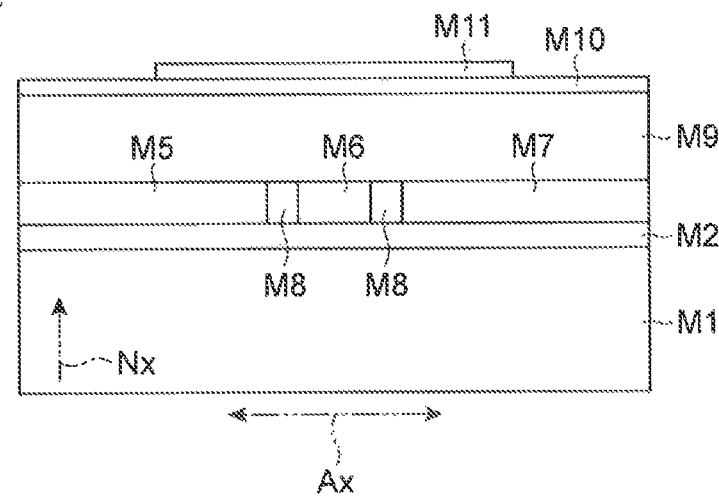
Figure 11A:
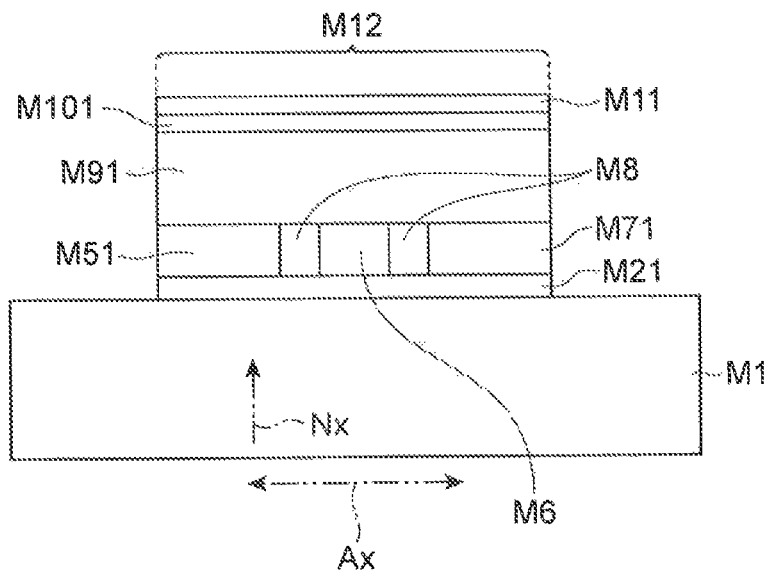
FIGS. 11A and 11B illustrate the method for producing the quantum cascade lasers according to the embodiments.

Next, as shown in FIG. 10C, a mask 11 is formed on the n-type contact layer M10 for forming a mesa waveguide M12 (described later). Using this mask M11, the semiconductor layers (that is, the n-type lower cladding layer M2, the core region M3 (second core regions M5 and M7), the n-type upper cladding layer M9, and the n-type contact layer M10) are etched by using wet etching or dry etching until the n-type semiconductor substrate M1 is exposed. By the etching, as shown in FIG. 11A, the mesa waveguide M12 corresponding to the mesa waveguide G is formed. Also in this case, the mask M11 is made of a dielectric film such as a SiO$_2$, SiON, or SiN film. As shown in FIG. 11A, when forming the mesa waveguide M12, the n-type lower cladding layer M2, the second core region M5, the second core region M7, the n-type upper cladding layer M9, and the n-type contact layer M10 are etched, which become, respectively, an n-type lower cladding layer M21, a second core region M51, a second core region M71, an n-type upper cladding layer M91, and an n-type contact layer M101.

Figure 11B:
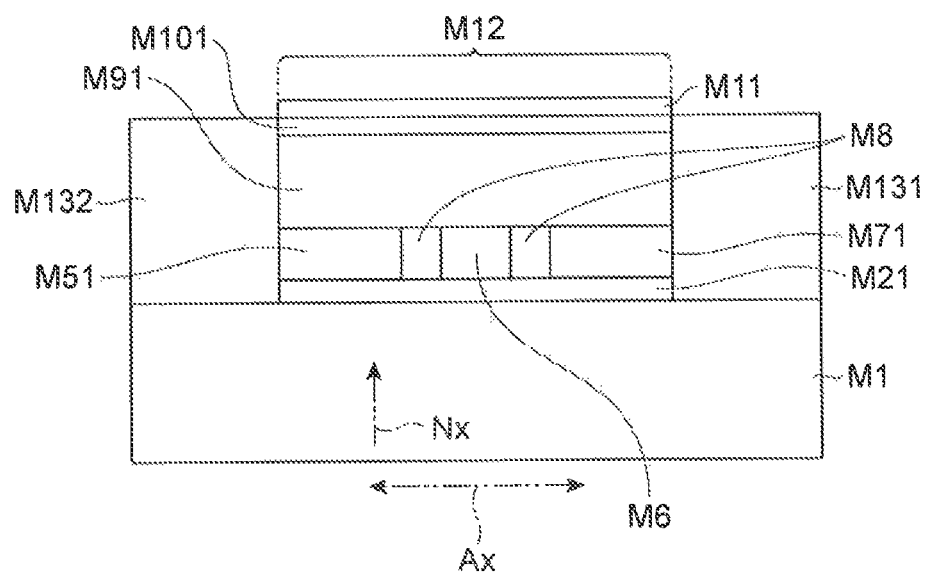

In a fourth growth, with the mask M11 being provided, semi-insulating semiconductor layers, such as Fe-doped InP layers, are selectively grown on the n-type semiconductor substrate M1 and side surfaces of the mesa waveguide M12. As shown in FIG. 11B, a current blocking layer M131 and a current blocking layer M132, which are formed of semi-insulating semiconductor having high resistance, are formed so as to be buried two side surfaces of the mesa waveguide M12. In this growth, the semi-insulating semiconductor layer is not grown on the mask M11.

Figure 12A:
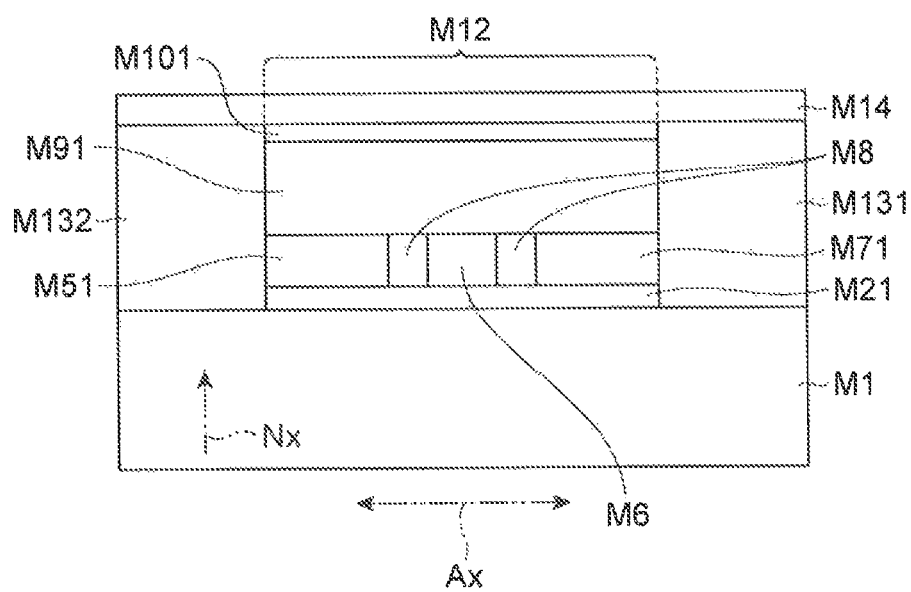
FIGS. 12A and 12B illustrate the method for producing the quantum cascade lasers according to the embodiments.

Then, after removing the mask M11, as shown in FIG. 12A, an upper electrode M14 is formed using an evaporation method or a sputtering method.

Figure 12B:
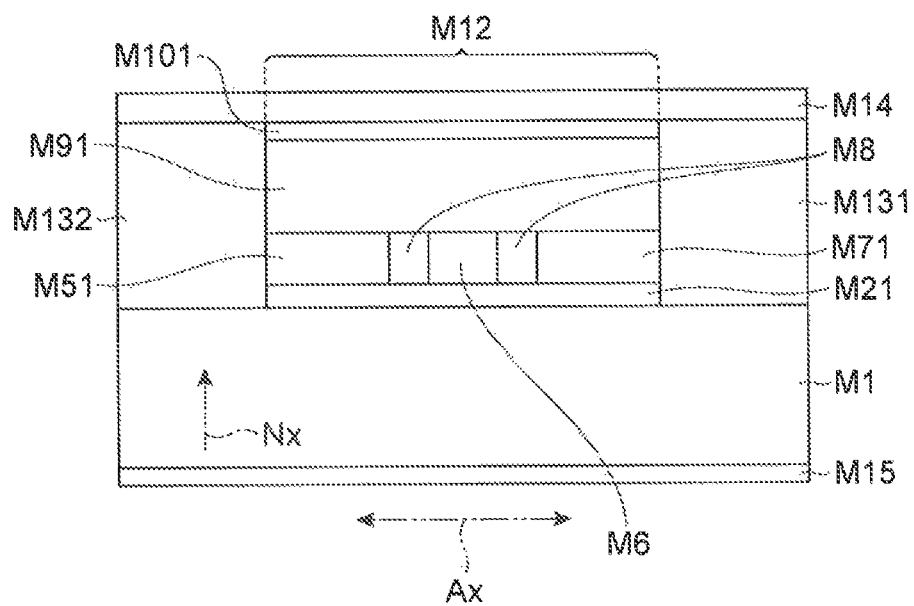

Lastly, by grinding the n-type semiconductor substrate M1, a wafer is made thin to a thickness allowing cleavage (100 μm or less). Then, a lower electrode M15 is formed on a back surface of the n-type semiconductor substrate M1 by using an evaporation method or a sputtering method. By performing the above-described steps, a QCL structure of the quantum cascade laser 1 is completed, as shown in FIG. 12B. It is possible to also form QCL structures of the quantum cascade laser 101 shown in FIG. 6A, the quantum cascade laser 102 shown in FIG. 6B, the quantum cascade laser 103 shown in FIG. 7A, and the quantum cascade laser 104 shown in FIG. 7B by performing a production method including steps that are similar to the steps illustrated in FIGS. 9A to 12B above.

Next, a method for producing the quantum cascade laser 105 shown in FIG. 8 will be described. As with the quantum cascade lasers 1 and 101 to 104, the steps illustrated in FIGS. 9A to 11A are also performed in the fabrication of the quantum cascade laser 105.

Figure 13A:
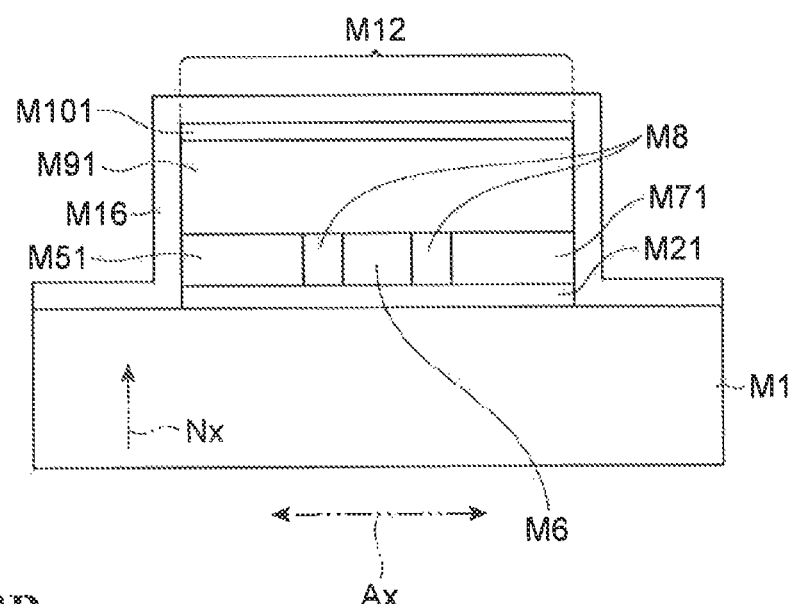
FIGS. 13A and 13B show the method for producing the quantum cascade laser according to the embodiment.

After performing the step illustrated in FIG. 11A, the mask M11 is removed. After removing the mask M11, as shown in FIG. 13A, an insulating layer M16 is formed so as to cover surfaces of the n-type semiconductor substrate M1, a top surface of the mesa waveguide M12, and side surfaces of the mesa waveguide M12. The insulating film M16 is formed of a dielectric film, such as a SiO$_2$, SiON, or SiN film.

Figure 13B:
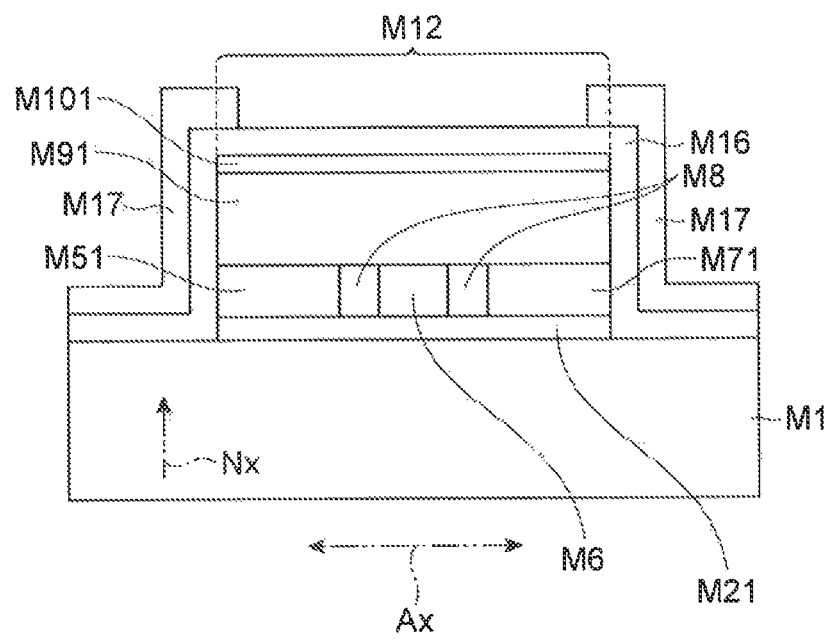

Thereafter, as shown in FIG. 13B, a photoresist mask M17 is formed by using, for example, photolithography method. Regions excluding a top portion of a mesa waveguide M12 are protected by the photoresist mask M17.

Figure 14A:
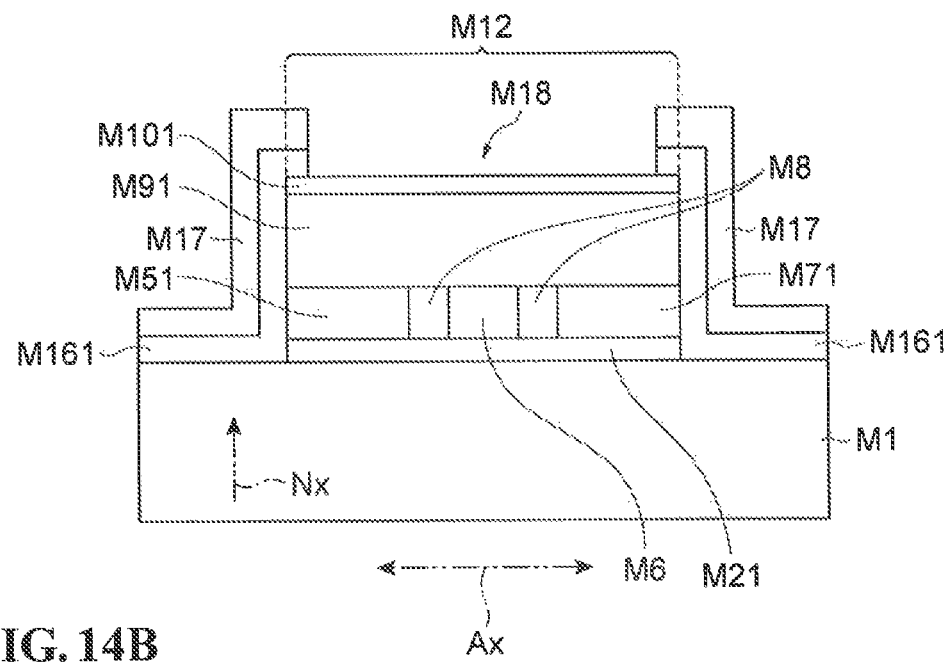
FIGS. 14A and 14B show the method for producing the quantum cascade laser according to the embodiment.

The insulating film M16 is etched by dry etching or wet etching using the photoresist mask M17 as an etching mask. By this etching, as shown in FIG. 14A, only the portion of the insulating film M16 at the top portion of the mesa waveguide M12 is selectively removed, so that an opening M18 is formed. After selectively etching the insulating film M16, the portion of the insulating film M16 remaining on the side surfaces of the mesa waveguide M12 becomes a current blocking layer M161 to confine a current into the mesa waveguide M12.

Figure 14B:
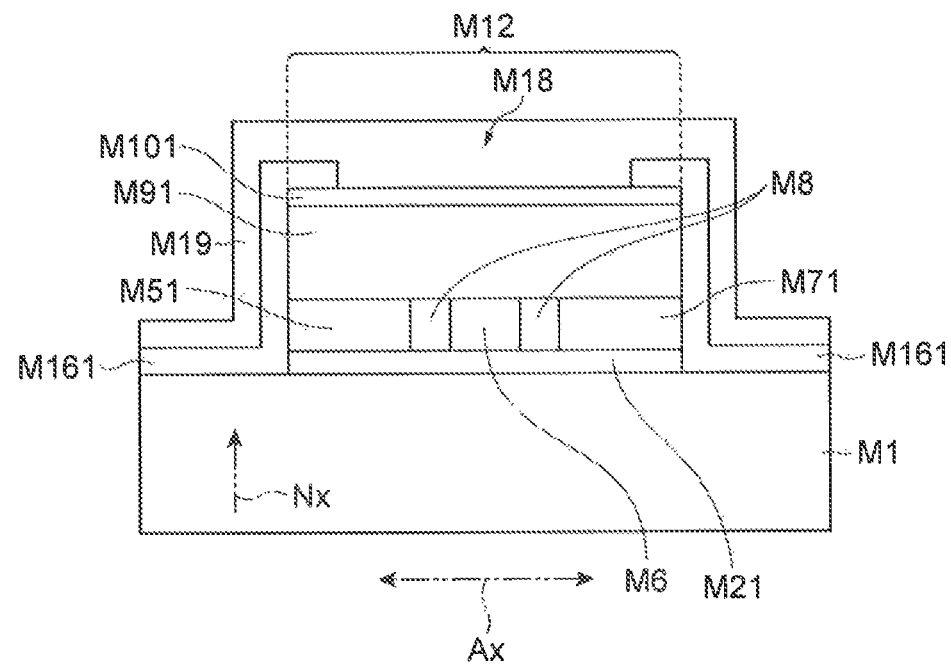

Next, the photoresist mask M17 is removed. By using an evaporation method or a sputtering method, as shown in FIG. 14B, an upper electrode M19 is formed in the opening M18 and on the insulating film M16 (current blocking layer M161).

Figure 15:
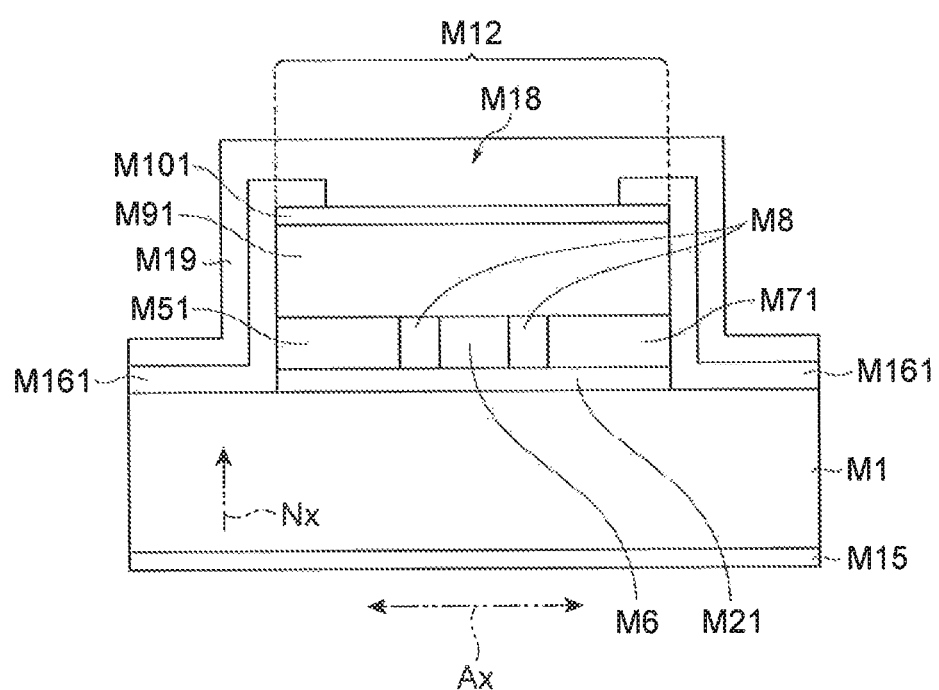
FIG. 15 shows the method for producing the quantum cascade laser according to the embodiment.
Figure 16:
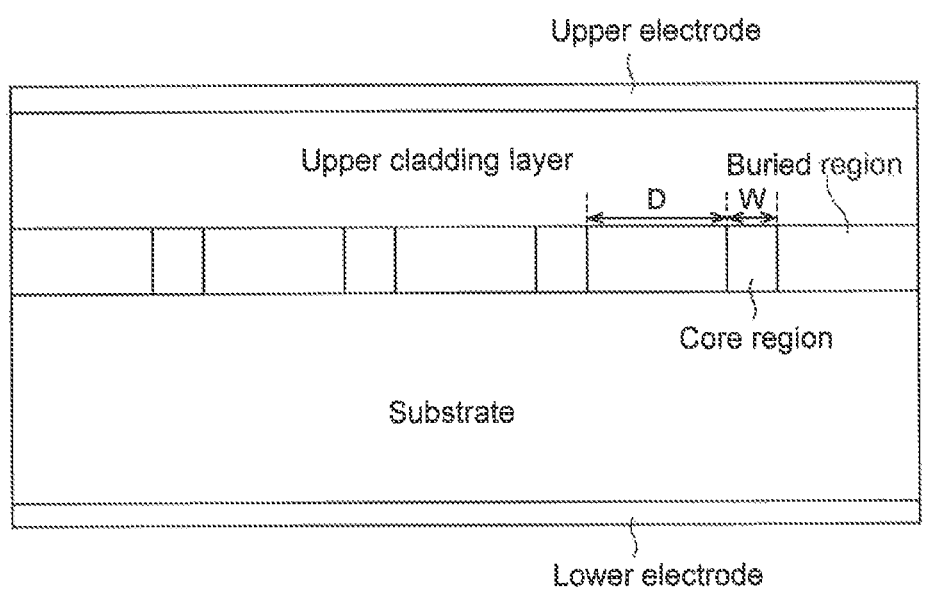
FIG. 16 shows a structure of a conventional quantum cascade laser.
Figure 17A:
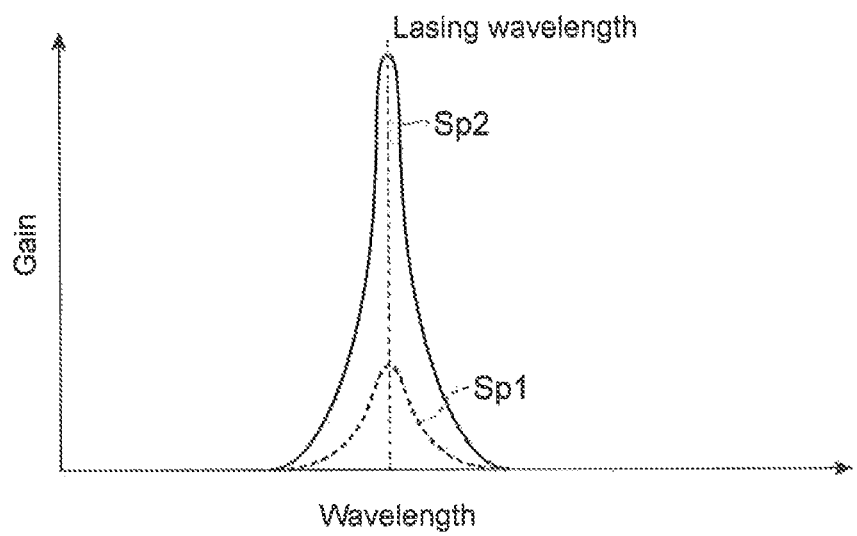
FIGS. 17A and 17B illustrate gain spectra of the conventional quantum cascade laser and a quantum cascade laser according to an embodiment.
Figure 17B:
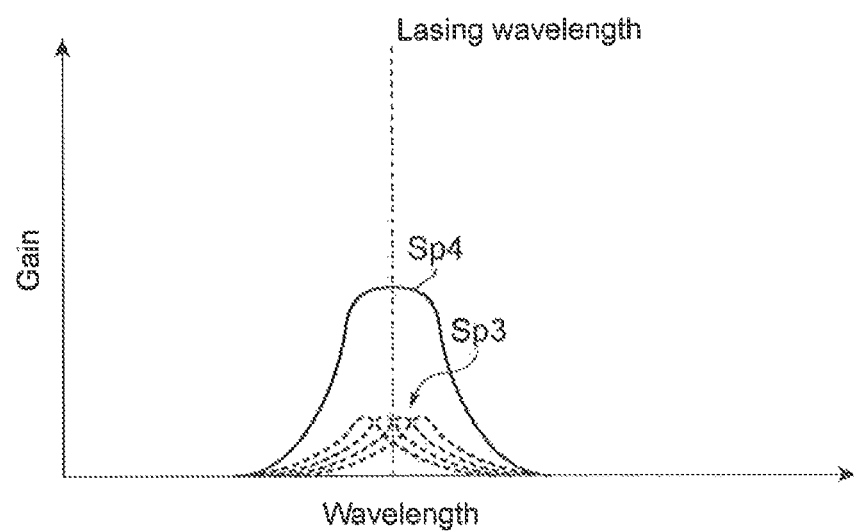

Lastly, by, for example, grinding the n-type semiconductor substrate M1, a wafer is made thin to a thickness allowing cleavage (100 μm or less). Then, a lower electrode M15 is formed on a back surface of the n-type semiconductor substrate M1 by using an evaporation method or a sputtering method. By performing the above-described steps, a QCL structure of the quantum cascade laser 105 is completed, as shown in FIG. 15.

Although the principles of the present invention in preferred embodiments are described, any person skilled in the art understands that the present invention may be changed with regard to arrangement and details without departing from such principles. The present invention is not limited to the particular structures disclosed in the embodiments. Therefore, rights regarding all modifications and changes within the scope of the claims and spirit thereof are claimed.

What is claimed is:
1. A quantum cascade laser comprising:
a semiconductor substrate including a principal surface;
a mesa waveguide disposed on the principal surface of the semiconductor substrate, the mesa waveguide including a light emitting region emitting light at a wavelength and an upper cladding layer disposed on the light emitting region, the mesa waveguide extending in a direction orthogonal to a reference direction; and
a current blocking layer formed on a side surface of the mesa waveguide, wherein
the light emitting region includes a plurality of core regions and a plurality of buried regions that are made of materials different from materials of the core regions,
at least one of the core regions has a width in the reference direction that is less than the wavelength of light emitted from the light emitting regions,
the mesa waveguide is configured to form a single waveguide in which light in the light emitting region extends in the reference direction through the core regions,
the core regions and the buried regions are alternately arranged in the reference direction,
the core region at a central portion of the mesa waveguide has a width smaller than a width of the core region at a peripheral portion of the mesa waveguide in the reference direction, and the upper cladding layer is disposed on each of the core regions and the buried regions so that current is injected into the plurality of core regions from the upper cladding layer.

2. The quantum cascade laser according to claim 1, wherein each core region has a width in a range of 0,5 µm to 10 µm in the reference direction.

3. The quantum cascade laser according to claim 1, wherein
each buried region has a width in a range of 0.5 µm to 10 µm in the reference direction.

4. The quantum cascade laser according to claim 1, wherein
the plurality of core regions includes a first core region and second core regions,
the first core region is positioned at the central portion of the mesa waveguide in the reference direction,
the first core region is arranged between the second core regions, and each second core region has a width in a range of greater than 1 times and less than 1.6 times a width of the first core region in the reference direction.

5. The quantum cascade laser according to claim 1, wherein the current blocking layer is formed of an insulating film.

6. The quantum cascade laser according to claim 5, wherein the insulating film is formed of at least one of $SiO_2$, SiON, SiN, alumina, BCB resin, and polyimide resin.

7. The quantum cascade laser according to claim 1, wherein the current blocking layer is formed of a semi-insulating semiconductor.

8. The quantum cascade laser according to claim 1, wherein. the current blocking layer is formed of InP or AlInAs doped with at least one of Fe, Ti, Cr, and Co.

9. The quantum cascade laser according to claim 1, wherein the buried regions are formed of a semi-insulating semiconductor.

10. The quantum cascade laser according to claim 1, wherein the buried regions are formed of InP or AlInAs doped with at least one of Fe, Ti, Cr, and Co.

11. The quantum cascade laser according to claim 1, wherein
each of the plurality of core regions includes a plurality of active layers and a plurality of injection layers,
the plurality of active layers and the plurality of injection. layers are alternately stacked on the principal surface,
each of the plurality of active layers emits light, and
each of the plurality of injection layers injects carriers into an active layer that is adjacent thereto.

12. A quantum cascade laser comprising:
a semiconductor substrate including a principal surface;
a mesa waveguide disposed on the principal surface of the semiconductor substrate, the mesa waveguide including a light emitting region emitting light at a wavelength and an upper cladding layer disposed on the light emitting region, the mesa waveguide extending in a direction orthogonal to a reference direction; and
a current blocking layer formed on a side surface of the mesa waveguide, wherein
the light emitting region includes a plurality of core regions and a plurality of buried regions that are made of materials different from materials of the core regions,
the core regions and the buried regions are alternately arranged in the reference direction,
the buried regions are made of a semi-insulating semiconductor having a lower refractive index than a refractive index of the core regions,
at least one of the core regions has a width in the reference direction that is less than the wavelength of light emitted from the light emitting region,
the plurality of core regions includes a first core region and second core regions,
the first core region is arranged between the second core regions,
the mesa waveguide is configured to form a single waveguide in which light in the light emitting region extends in the reference direction through the first and second core regions, and
in the reference direction, each second core region has a width in a range of greater than 1 times and less than 1.6 times a width of the first core region.

* * * * *